United States Patent [19]
Hata et al.

[11] Patent Number: 5,245,295
[45] Date of Patent: Sep. 14, 1993

[54] METHOD OF DETECTING A VARIATION IN STRAY CAPACITANCE BY USE OF A PLL CIRCUIT

[75] Inventors: Shuji Hata; Osamu Murasawa, both of Tokyo, Japan

[73] Assignee: Jalco Co., Ltd., Tokyo, Japan

[21] Appl. No.: 912,692

[22] Filed: Jul. 13, 1992

[30] Foreign Application Priority Data

Jul. 25, 1991 [JP] Japan .................. 3-207317

[51] Int. Cl.$^5$ ............................................ G01F 23/26
[52] U.S. Cl. .................................... 324/683; 324/681; 324/682; 324/674; 324/675; 324/661; 324/606; 331/65
[58] Field of Search ............... 324/681, 683, 660, 662, 324/682, 674, 675, 667, 668; 331/65

[56] References Cited

U.S. PATENT DOCUMENTS

| | | | |
|---|---|---|---|
| 4,169,260 | 9/1979 | Bayer | 331/65 |
| 4,173,736 | 11/1979 | Adams | 331/65 |
| 4,228,393 | 10/1980 | Pile | 331/65 |
| 4,347,740 | 9/1982 | Townsend | 331/65 |
| 4,347,741 | 9/1982 | Geiger | 331/65 |
| 4,972,566 | 11/1990 | Andersen . | |
| 5,034,722 | 7/1991 | Premack | 331/65 |

FOREIGN PATENT DOCUMENTS 918563 2/1963 United Kingdom .
88/10412 12/1988 World Int. Prop. O. .

Primary Examiner—Kenneth A. Wieder
Assistant Examiner—Jose M. Solis
Attorney, Agent, or Firm—Rogers & Killeen

[57] ABSTRACT

Disclosed is a method of detecting a variation in stray capacitance by use of a PLL circuit. This method involves the steps of: setting respectively a freerunning frequency and a capture range of a phase-locked loop circuit so that a range in which an output frequency of a pre-oscillator changes extends to an interior of the capture range of the phase-locked loop circuit, the output frequency being determined by a synthetic time constant obtained by adding up a variation value of an electric capacitance or the like that is detected by a sensor and a reserve time constant preset in a time constant determining module when detecting the stray capacitance by employing the sensor for detecting the variation in the stray capacitance in contact or non-contact with a body to be detected and a capacitance detecting means including the pre-oscillator having the time constant determining module connected to the sensor and the phase-locked loop circuit connected to the pre-oscillator; detecting a change in a freerunning frequency control voltage in a locked state of the phase-locked loop circuit, the change being caused with the variation in the electric capacitance or the like that is detected by the sensor; and detecting a state variation of the detected body.

6 Claims, 13 Drawing Sheets

METHOD OF DETECTING A VARIATION IN STRAY CAPACITANCE BY USE OF A PLL CIRCUIT

BACKGROUND OF THE INVENTION

1. Field of the Invention

The present invention relates generally to a method of detecting a variation in stray capacitance and, more particularly, to a method of accurately detecting and finding out a variation in the stray capacitance in a wide range from an infinitesimal fluctuation to a relatively large fluctuation by use of a phase-locked loop circuit (hereinafter referred to as a PLL circuit) that could not be obtained by a conventional detecting method.

2. Related Background Art

It is required to detect a variation in stray capacitance more accurately and simply for foreseeing a danger and a notifying operation in a place where the stray capacitance varies concomitantly with a change or fluctuation in state or situation of a body to be detected as in the case of: detecting and finding out approaching and contact states or a release state in such portions that an approach to and contact with or a release from, e.g., a human body and a solid-state substance are not permitted; uncovering an intermix of air bubbles and foreign matters in an interior of a liquid material transfer pipe such as a hydraulic brake hose in which an existence of the air bubbles is not allowed; and further monitoring a level of storage quantity of the liquid material in a liquid material storage tank, etc.

A variety of detecting apparatuses have hitherto been known as the above-mentioned apparatus for detecting the variation in the stray capacitance. For example, there is an apparatus for detecting the variation in the stray capacitance of a sensor that is caused corresponding to a fluctuation in state of the detected body. This apparatus is, as illustrated in a functional block diagram of FIG. 12, constructed of an oscillator 1, a wave detection circuit 2, a filter 3, a voltage comparing circuit 4 and an output circuit 5. Note that in FIG. 12, 1a designates an oscillation circuit thereof; 1b a frequency determining block; 6 a sensor; 7 an alarm; and 8 a reference voltage. The oscillator 1 to which the sensor 6 is connected consists of the frequency determining block 1b having a constant quality factor Q and the oscillation circuit 1a. Further, a frequency of the oscillator 1 can be set high or low. If set high, the frequency determining block 1b of the oscillator 1 is composed mainly of a coil and a capacitor.

FIG. 13 is a functional block diagram showing a constructive example of the oscillator 1 in the conventional apparatus, illustrated in FIG. 12, for detecting the variation in the stray capacitance. The same symbols in FIG. 13 as those in FIG. 12 indicate the like functional blocks in FIG. 12. However, the symbol L represents a coil, and C denotes a capacitor. Now, when setting a frequency as high as 1 MHz–200 MHz to the above-mentioned oscillator 1, the frequency determining block 1b is composed chiefly of the coil L and the capacitor C that are connected in parallel to have a constant resonant frequency and the quality factor Q.

Referring to FIG. 12, if the connected sensor 6 is made to approach or contact the detected body, the wave detection circuit 2 is informed of fluctuations in oscillation output amplitude voltage and in output frequency of the oscillator 1 that are caused with changes both in the resonant frequency and in the quality factor Q of this frequency determining block 1b or a stoppage of an oscillating state. The wave detection circuit 2 detects an inputted signal and inputs a voltage level which has been converted into a DC component to the filter 3 of the next stage. The filter 3 having a fixed time constant smooths the DC component by making it pass therethrough. A DC-converted voltage is compared with the preset reference voltage 8 in the voltage comparing circuit 4. This compared result is detected as a variation in the stray capacitance. This detected result is transferred via the output circuit 5 to the alarm 7. The variation in the stray capacitance that is detected by the sensor 6 is notified as a piece of information indicating that there is a change in state of the detected body. Note that some of the apparatuses for detecting the variation in the stray capacitance at a relatively high accuracy are constructed to detect a fluctuation in the amplitude voltage more clearly by connecting a tuning circuit (or band-pass filter) to the output side of the oscillation circuit 1a of FIG. 12.

When using the oscillator 1 having a high frequency, however, this effectively acts to an infinitesimal fluctuation sensed by the sensor 6. While on the other hand, however, the sensor 6 itself turns out to be an antenna, resulting in a state where the electric waves are constantly radiated. This conduces to a possibility in which a hindrance to the electric waves arises in ambient areas. Hence, it is impossible to take a relatively large distance between the sensor 6 and the oscillator 1. On the other hand, if the distance between the sensor 6 and the oscillator 1 is taken large by employing a coaxial cable or the like, a sensitivity to the infinitesimal change in the stray capacitance declines due to a self-capacitance possessed by the coaxial cable itself. In some cases, the oscillating state can not be maintained, and the detection range of the stray capacitance is therefore remarkably narrowed. Further, problems arise, wherein even if the sensitivity of the oscillator 1 is enhanced including the sensor 6, a sharpness is provided, and therefore the operation becomes unstable, or a malfunction is induced. Namely, the conventional detecting apparatus merely continues the oscillation stopping condition against the large variation in the stray capacitance. The actually operating range is limited so much. As described above, the conventional method of setting the oscillator 1 at the high frequency, though it exhibits an increased sensitivity in the very limited range, presents a good number of disadvantages wherein the type of the detected body is limited and so on because of causing the electric wave hindrance and the impossibility to take a large distance between the apparatus body and the sensor 6.

In view of these points, there is also a prior art apparatus of such a system that the oscillator 1 is set at a relatively low frequency on the order of, e.g., 500 KHz. In the case of this system, the frequency determining block 1b serving as a main component is constructed of the capacitor and the resistor. FIG. 14 is a functional block diagram illustrating a constructive example in the case of setting the oscillator 1 at a relatively low frequency. The same symbols in FIG. 14 as those in FIG. 12 indicate the identical functional blocks with those in FIGS. 12 and 13. However, the symbol R designates the resistor. In the oscillator 1 in FIG. 14, the frequency determining block 1a is composed of the resistor R and the capacitor C that are basically connected in series.

In the apparatus, of FIG. 12, constructed to set the oscillator 1 at the low frequency, the capacitance variation detected by the sensor 6—i.e., a frequency fluctuation produced during a detection of the stray capacitance and a fluctuation in the oscillation output amplitude voltage—are replaced with fluctuations in the voltage level of the DC component by means of the wave detection circuit 2 and the filter 3 as well. The voltage comparing circuit 4 compares an obtained voltage with the preset reference voltage 8, thereby detecting a variation in the stray capacitance. This point is the same as that in the case of setting the oscillator 1 at the high frequency.

The detecting system which uses the low frequency has the following disadvantages. The sensitivity to the variation in the stray capacitance is low because of the low frequency. However, the fluctuations both in the frequency and in the oscillation output amplitude voltage are produced infinitesimally corresponding to the variation in the stray capacitance. However, if the fluctuations are converted into voltage by means of a circuit connected to a posterior portion, since the fluctuation quantity is too small, the comparison is quite difficult. It is because a difference from the preset reference voltage 8 is infinitesimal. This lacks the practicability in combination with the low sensitivity given above.

As explained above, the foregoing problems are inherent in the conventional apparatuses for detecting the variation in the stray capacitance in any system, whether the oscillator frequency is set high or low.

SUMMARY OF THE INVENTION

Accordingly, it is a general object of the present invention, which obviates the foregoing disadvantages inherent in the conventional apparatuses for detecting a variation in stray capacitance, to provide a method of stably detecting a variation in stray capacitance, wherein an oscillator having a low frequency is usable by employing a PLL circuit, an infinitesimal fluctuation can be accurately detected, a detection range is sufficiently wide, a malfunction is extremely small, and an ambient influence by unnecessary electric waves is minimized.

To accomplish this object, according to one aspect of the invention devised to solve the above-mentioned problems, there is provided a method of detecting a variation in stray capacitance by use of a PLL circuit, comprising the steps of: setting respectively a freerunning frequency and a capture range of a phase-locked loop circuit so that a range in which an output frequency of a pre-oscillator changes extends to an interior of the capture range of the phase-locked loop circuit, the output frequency being determined by a synthetic time constant obtained by adding up a variation value of an electric capacitance or the like that is detected by a sensor and a reserve time constant preset in a time constant determining module when detecting the stray capacitance by employing the sensor for detecting the variation in the stray capacitance in contact or non-contact with a body to be detected and a capacitance detecting means including the pre-oscillator having the time constant determining module connected to the sensor and the phase-locked loop circuit connected to the pre-oscillator; detecting a change in a freerunning frequency control voltage in a locked state of the phase-locked loop circuit, the change being caused with the variation in the electric capacitance or the like that is detected by the sensor; and detecting a state variation of the detected body.

According to this invention, the oscillator having the low frequency is usable by employing the PLL circuit. It is therefore possible to minimize an ambient radiation of unnecessary electric waves and definitely capture even an infinitesimal change in the frequency which is caused corresponding to the variation in the stray capacitance as a change per cycle of the frequency at that point of time. The range for detecting the variation in the stray capacitance is therefore sufficiently bread. In addition, there is particularly no necessity for putting a shape and form of a sensor unit into a discussion on condition that the sensor is capable of capturing the variation in the stray capacitance and electrically transmitting it.

DETAILED DESCRIPTION OF THE PREFERRED EMBODIMENTS

Embodiments of the present invention will next be described with reference to the drawings. The fundamental principle of a PLL circuit employed in this invention will be explained in advance of the description of the embodiments.

The PLL circuit is a circuit exhibiting such a characteristic that the circuit oscillates at the same frequency as an outside input frequency by forcibly changing a freerunning frequency with respect to the input frequency from outside in a range (hereafter referred to as a variable power range) where a self-possessed oscillation frequency (freerunning frequency) is variable; and further the circuit oscillates at the same frequency by following up, if the outside input frequency fluctuates, these fluctuations.

Figure 2:
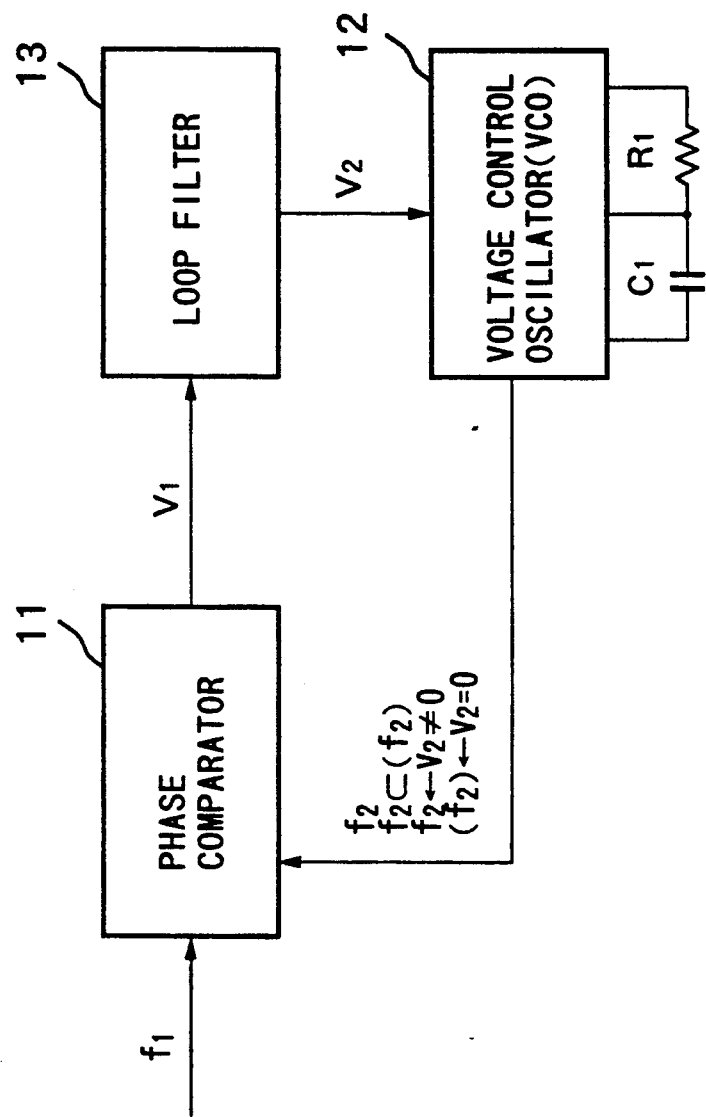
FIG. 2 is a block diagram illustrating the PLL circuit of the present invention.

FIG. 2 is a functional block diagram illustrating the basic construction of this PLL circuit. Referring to the FIGURE, the numeral 11 represents a phase comparator; 12 a voltage control oscillator (hereafter abbreviated to VCO); 13 a loop filter; $R_1$ a resistor; and $C_1$ a capacitor. Further, the symbol $f_1$ designates an input frequency supplied from outside to the phase comparator 11; $f_2$ an output frequency in a state where the free-running frequency is varied after controlling a voltage of VCO 12; ($f_2$) an output frequency identical with the freerunning frequency when VCO 12 is not yet voltage-controlled; $v_1$ an output voltage of the phase comparator 11; and $v_2$ an output voltage of the loop filter 13.

An oscillation frequency of VCO 12 is variably controlled (voltage control) by a control voltage inputted from outside. The control voltage is, however, the output voltage $v_2$ generated by the loop filter 13. This output voltage $v_2$ is not initially generated in the PLL circuit. Namely, this implies a state where VCO 12 is not voltage-controlled. Hence, VCO 12 oscillates at the freerunning frequency ($f_2$) with a time constant determined by the preset resistor R1 and capacitor $C_1$, and this turns out to be an initial output frequency ($f_2$) of VCO 12 which is supplied as a comparative reference input frequency to the phase comparator 11.

The following is an explanation of the operations subsequent to this initial state. The phase comparator 11 makes a real-time comparison between phases of two kinds of frequency inputs, i.e., those of the input frequency $f_1$ from outside and the output frequency ($f_2$) of VCO 12. A difference therebetween is generated as the output voltage $v_1$. If the two frequencies $f_1$ and ($f_2$) are different, and if a phase difference therebetween is—even when the frequencies are the same—an angle other than 90°, the phase comparator 11 generates a positive voltage when voltage polarities at that moment are equal to each other and, whereas if opposite to each other, generates a negative voltage.

The loop filter 13 integrates the output voltage $v_1$ of the phase comparator 11 to generate the positive or negative output voltage $v_2$ of DC component. VCO 12 is supplied with this output voltage $v_2$ as a freerunning frequency control voltage for changing the freerunning frequency of VCO 12. VCO 12 thereby controls the output frequency in the variable power range to change it in such a direction that the initial output frequency ($f_2$) is equalized to the input frequency $f_1$. VCO 12 feeds back it again to the phase comparator 11 as the output frequency $f_2$ which has undergone the voltage control.

In the phase comparator 11, the previous input frequency $f_1$ is equal to the output frequency $f_2$ of VCO 12 which has been output-controlled and then fed back. Besides, when a phase difference therebetween becomes 90°, the output voltage $v_1$ of this phase comparator 11 almost disappears (approximates substantially to 0), and hence it follows that the output voltage $v_2$ of the loop filter 13 also approximates to 0.

As a result, VCO 12 starts shifting from a state of the voltage control that has been performed so far to a state of non-voltage control. Upon an onset of this shift, the output frequency $f_2$ which has been fed to the phase comparator 11 starts its change. Concomitantly with this, the output voltage $v_1$ is generated again in the phase comparator 11, and, as described above, the looped operations are repeated.

The foregoing looped operations are instantaneously produced within the PLL circuit at an electrical speed. For practicality, VCO 12 is controlled to be equalized to the input frequency $f_1$ by the stable control output voltage $v_2$ of the loop filter 13 which is generated correspondingly to the output voltage $v_1$ of the phase comparator 11. VCO 12 then oscillates in a stable state at the same frequency as the input frequency $f_1$ and comes into a state where it performs the follow-up action. As explained above, the state where VCO 12 oscillates at the same frequency while following up the input frequency $f_1$ to the phase comparator 11 is called a locked state where the PLL circuit is locked.

Figure 3:
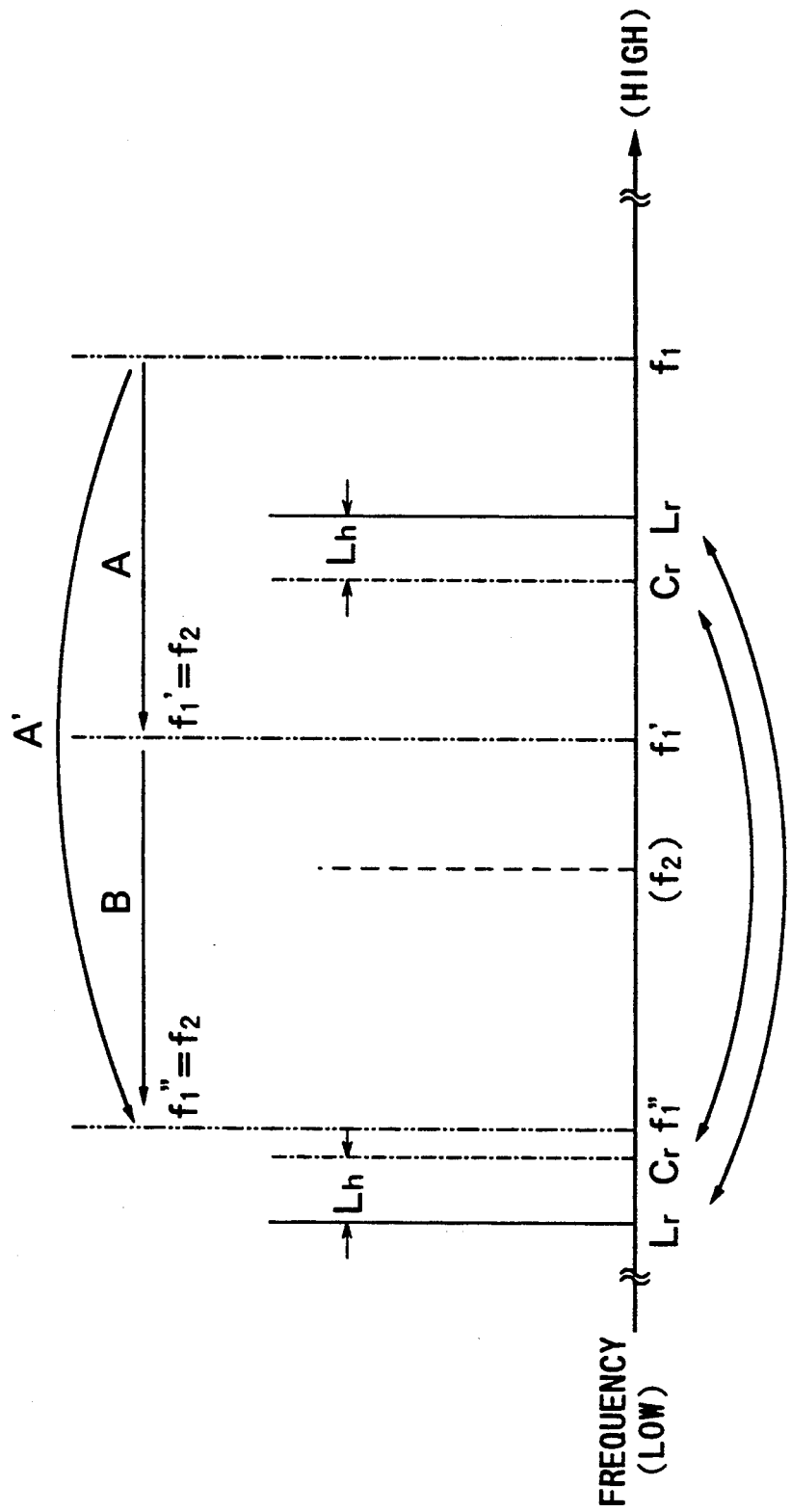
FIG. 3 is a diagram illustrating lock range and capture range in the present invention.

From one aspect, when the PLL circuit is in the locked state, the input frequency $f_1$ is so changed as to gradually move away from the output frequency $f_2$ of VCO 12. The locked state can not be held from a certain point. Defined herein as a lock range Lr (this range is also called a holding range or a tracking range) is a range of deviation between the output frequency $f_2$ of VCO 12 which has followed up the input frequency $f_1$ and the output frequency ($f_2$) during the non-voltage control of VCO 12, i.e., the initial freerunning frequency. FIG. 3 shows one example of the lock range Lr.

From another aspect, when the phase comparator 11 makes a real-time comparison between the phases of the input frequency $f_1$ outside this lock range Lr and of the output frequency ($f_2$) of VCO 12, a posterior circuit is on the verge of execution of the above-mentioned operation. However, the input frequency $f_1$ deviating from the lock range Lr illustrated in FIG. 3 is out of the variable power range of the output frequency $f_2$ of VCO 12. For this reason, the follow-up action can not be effected. Hence, even though the output voltage $v_1$ of the phase comparator 11 instantaneously becomes 0, however, in the great majority of cases, there is developed a state where the positive voltage and the negative voltage are alternately outputted. In the loop filter 13 for generating the output voltage $v_2$ by integrating the output voltage $v_1$ of this phase comparator 11, the positive and negative voltages offset each other. This results in a 0-state where no output voltage $v_2$ is generated. When there is no output voltage v2 of the loop filter 13, this implies a state in which VCO 12 is not voltage-controlled, and hence the PLL circuit oscillates at the initial freerunning frequency. The output frequency thereof becomes ($f_2$), and this state is therefore called a non-locked state of the PLL circuit. Note that the PLL circuit is also, as in the same way described above, brought into the non-locked state when there is no input frequency $f_1$ to the phase comparator 11. The PLL circuit assumes a status where this non-locked state is equal to the previous initial state.

When the PLL circuit is initially in the non-locked state, the input frequency $f_1$ is changed gradually to $f_1'$ or $f_1''$ (corresponding to A or A' in FIG. 3). This frequency is approximated to the output frequency ($f_2$) of VCO 12. Then, the PLL circuit comes into the locked state from a certain point of time. Called a capture range Cr (this range is also known as a lead-in range or a lock-in range) is a range of deviation with respect to the initial freerunning frequency, i.e., the output frequency ($f_2$) during the non-voltage-control of the output frequency f2 of VCO 12 which starts following up the input frequency $f_1'$ or $f_1''$ at this moment. FIG. 3 illustrates one example of the capture range Cr.

This capture range and the above-stated lock range Lr are both shown therein as ranges spreading substantially uniformly towards the higher frequency and the lower frequency, with the initial freerunning frequency of VCO 12, i.e., the output frequency ($f_2$) being centered. Operating state in the capture range Cr and the lock range Lr are herein different depending on whether the PLL circuit comes into the locked state on capturing the input frequency $f_1'$ or the non-locked state upon a separation of the captured input frequency $f_1'$. Hence, there is the fact that the capture range Cr is slightly narrower than the lock range Lr, and a hysteresis Lh exists therebetween. FIG. 3 demonstrates one example of this hysteresis Lh. Note that the axis of abscissa indicates the frequency which increases from left to right in FIG. 3. In the above-mentioned PLL circuit, a width of the capture range Cr is arbitrarily adjustable within a scope that does not exert influences on various operations of the PLL circuit by altering the characteristics possessed by the loop filter 13 of FIG. 2 or adjusting a level of the output voltage $v_2$, i.e., the freerunning frequency control voltage of VCO 12 by use of a variable resistor or altering the oscillation characteristics of VCO 12.

Variations caused within the circuitry, viz., variations in the output voltage $v_1$ of the phase comparator 11 and the output voltage $v_2$ of the loop filter 13 are properly utilized and processed by the various looped operations of the PLL circuit described above. It is thereby possible to accurately capture a situation of how the frequency inputted to the PLL circuit fluctuates. Further, the description given above has dealt with the arrangement that the freerunning frequency ($f_2$) of VCO 12 in the PLL circuit components is fixed beforehand, and the various looped operations are performed by fluctuating the fluctuations of the input frequency $f_1$ to $f_1'$ and $f_1''$. In contrast with the above-described example, however, the input frequency is fixed in the PLL circuit, while the freerunning frequency ($f_2$) fluctuates (transits). Even in such a state, both the capture range Cr and the lock range Lr transit with the fluctuations (transitions) of the freerunning frequency ($f_2$) on condition that the fluctuations (transitions) fall within such a scope that the characteristics of the loop filter 13 exert no influence on VCO 12. The PLL circuit is therefore capable of performing the same various looped operations as the above-mentioned. Besides, even if both the input frequency $f_1$ and the freerunning frequency ($f_2$) fluctuate (transit), the PLL circuit can effect the same various looped operations as those described in the above example. This implies that there exists a relative relation between the input frequency $f_1$ and the freerunning frequency ($f_2$) of VCO 12 when observing the respective operations on the basis of the phase comparator 11 in the components of the PLL circuit.

According to the present invention, a separate preoscillator is provided in addition to the foregoing PLL circuit. An oscillation output thereof corresponds to the above-described input frequency $f_1$, and the PLL circuit previously receives it. An output frequency of the preoscillator or the output frequency of the voltage control oscillator itself of the PLL circuit change due to a variation in the electric capacitance or the like that is detected by the sensor. The whole circuit is thus constructed. Effected is a detection of how the operation state of the PLL circuit changes concomitantly with variation states of the frequencies thereof.

Hence, according to the present invention, attention is paid to the relative relation between the input frequency $f_1$ and the freerunning frequency ($f_2$) of VCO 12, the locking and unlocking operations with respect to the fluctuating input frequency $f_1$ defined as a characteristic of the PLL circuit and the respective relations between capture range Cr, the lock range Lr and the hysteresis Lh. The above-stated circuitry is adopted, thereby accurately detecting the variations in the electric capacitance or the like and particularly the state variations in the stray capacitance. The present invention will hereinafter be described by way of embodiments.

EMBODIMENT 1

Figure 1:
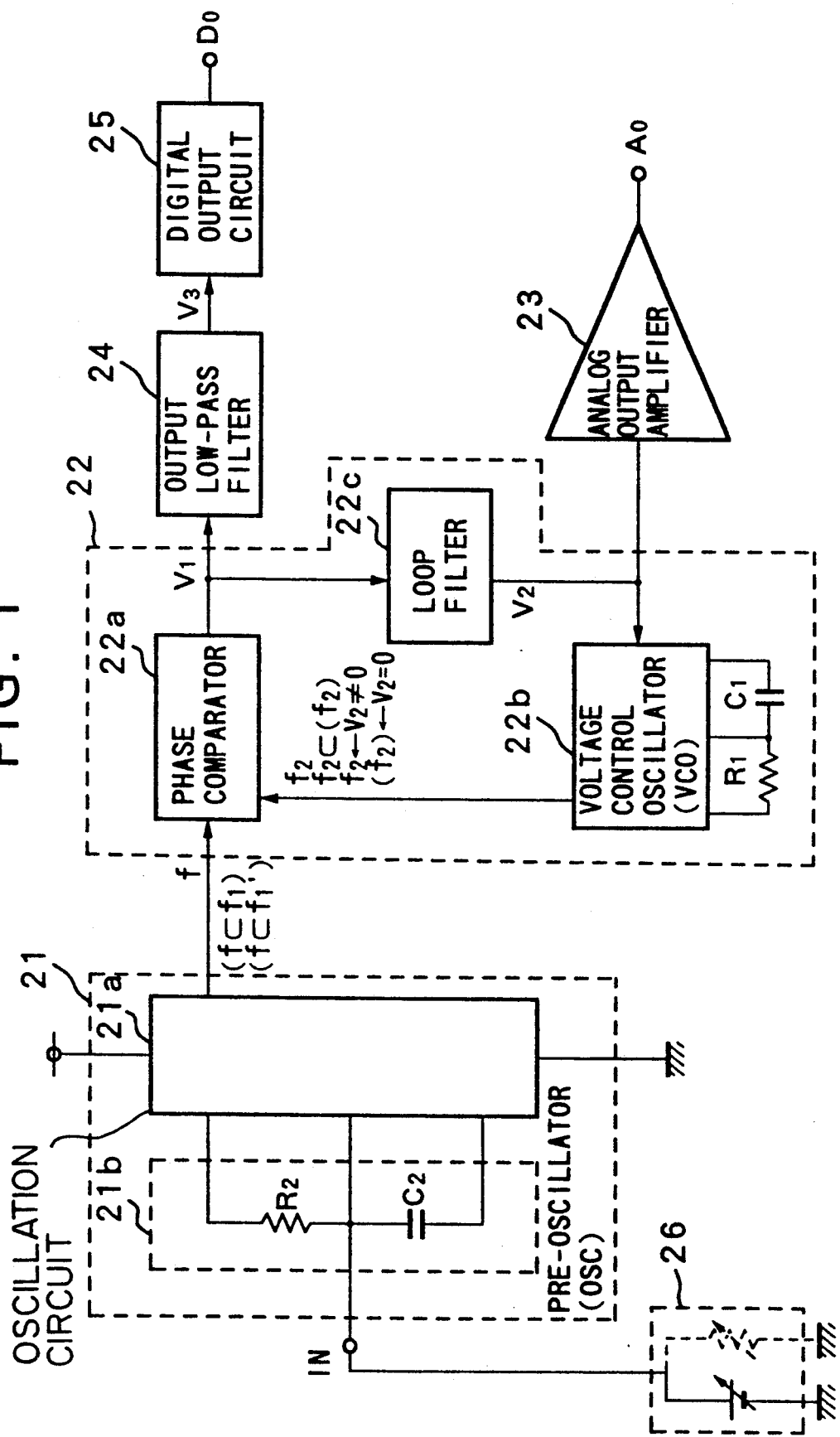
FIG. 1 is a block diagram of an embodiment of the present invention.

This invention will be summarized with reference to FIGS. 3 and 1. To start with, the preoscillator 21 (hereafter abbreviated to OSC 21), which has the output frequency $f_1$ varying with a fluctuation signal of the electric capacitance or the like (such as a stray capacitance) that is detected from a sensor 26, sets a condition on the assumption that the output frequency $f_1$ when its capacitance changes are not detected is out of the lock range Lr of the PLL circuit that receives the output frequency $f_1$. Subsequently, OSC 21 sets a condition so that the output frequency $f_1'$ varying with, when detecting the capacitance change, this detection falls within the capture range Cr of the PLL circuit 22, and this PLL circuit 22 operates in the locked state. Set properly beforehand and adjusted in view of satisfying these two conditions are the output frequency ($f_2$) (freerunning frequency) of VCO 22b possessed by the PLL circuit 22, a width of the capture range Cr and a reserve time constant for determining the output frequency $f_1$ of OSC 21. According to the invention in this embodiment, a variation quantity of the stray capacitance is detected from a voltage difference between the control voltage of the freerunning frequency of the PLL circuit 22 coming into the locked state when the stray capacitance changes during a detection of the capacitance and the control voltage of the freerunning frequency which is outputted in the non-locked state during a non-detection of the capacitance, i.e., when the stray capacitance does not change.

FIG. 1 is a functional block diagram showing one constructive example of the principal portion of a detection module in a detecting apparatus for practicing the method of detecting a variation in stray capacitance according to the invention described above. Referring to the FIGURE, the symbol 21a designates an oscillation circuit of OSC 21; 21b a CR component; 22a a phase comparator of the PLL circuit 22; 22b a VCO; 22c a loop filter; 23 an analog output amplifier; 24 an output low-pass filter; 25 a digital output circuit; 26 a sensor; $R_1$, $R_2$ resistors; and $C_1$, $C_2$ capacitors. In the FIGURE, the symbol In denotes a fluctuation signal input point of the electric capacitance or the like that is obtained from the sensor 26, and f indicates the whole of the output frequencies of OSC 21. Among the frequencies f, $f_1$ represents an output frequency before detecting the variation (during a non-detection) of the stray capacitance, and $f_1'$ denotes an output frequency after detecting the variation (during a detection) of the stray capacitance. On the other hand, the symbol $f_2$ indicates an output frequency in a varied state of the freerunning frequency when VCO 22b is voltage-controlled (during voltage control); ($f_2$) indicates the same output frequency as the freerunning frequency when VCO 22b is not voltage-controlled (during non-voltage-control); $v_1$ is an output voltage of the phase comparator 22a; $v_2$ is an output voltage of the loop filter 22c; $v_3$ is an output voltage of the output low-pass filter 24; $D_0$ is an output signal of the digital output circuit 25; and $A_0$ is an output signal of the analog output amplifier 23.

In OSC 21 of FIG. 1, the CR component 21b consisting of the resistor $R_2$ and the capacitor $C_2$ is connected to the oscillation circuit 21a, thereby forming the reserve time constant. A fluctuation signal of the electric capacitance or the like (stray capacitance) obtained from the sensor 26 is inputted via the fluctuation signal input point In to the connecting point between the resistor $R_2$ and the capacitor $C_2$. The detecting apparatus is thus constructed.

In the CR component 21b described above, if a signal—this signal being inputted via the fluctuation signal input point In from the sensor 26 and indicating a state fluctuation of a body to be detected—is defined as a capacitance variation type signal, a capacitance component C thereof is synthesized with the reserve time constant, and if defined as a resistance variation type signal, a resistance component R thereof is synthesized therewith. The CR component 21b incorporates a function to further enhance the state variation of the detected body.

Given to and received by the posterior PLL circuit 22 according to the invention claimed in claim 1 are fluctuations in the output frequencies f of OSC 21 which directly undergoes influences of the variations in the capacitance component C and in the resistance component R. The state variation of the detected body is thus detected.

For this reason, in the detecting apparatus depicted in FIG. 1, a synthetic time constant is formed of a synthesized capacitance value obtained by adding up a capacitance of the capacitor $C_2$ of the CR component 21b and the capacitance component C of the detected body that is obtained from the sensor 26. Changed are the output frequencies f of OSC 21 which are to be received by the PLL circuit 22. Herein, the PLL circuit 22 incorporates the same function as that of the PLL circuit explained in FIG. 2 and is prepared with the state variation of the detected body in the non-locked state.

In this detecting apparatus, the output frequency of OSC 21 is $f_1$ before detecting a variation in the stray capacitance, and the non-locked state is developed at the frequencies out of (outside) the width of the capture range Cr of the PLL circuit 22. Therefore, the VCO 22b thereof oscillates at the output frequency ($f_2$) (freerunning frequency), and a control voltage of the freerunning frequency becomes 0. Information about this state is given to outside, and hence the analog output signal $A_0$ outputs 0 (0 volt), while the digital output signal $D_0$ outputs 1 (constant voltage value), respectively.

Next, if there is a fluctuation signal of the electric capacitance or the like (stray capacitance) that is obtained from the sensor 26, the output frequency $f_1$ before a variation of OSC 21 changes to the output frequency $f_1'$. When this change is caused, the PLL circuit 22 prepared with a detection of the fluctuation signal of the electric capacitance thereof makes a real-time comparison between a phase of the output frequency $f_1'$ of OSC 21 and a phase of the output frequency ($f_2$) of VCO 22b. The PLL circuit 22 acts to cause VCO 22b to effect the follow-up action. Herein, with an initial adjustment, the output frequency ($f_2$) (freerunning frequency) of VCO 22b is set in the vicinity of the output frequency $f_1'$ of OSC 21 when detecting the capacitance variation. The output frequency $f_1'$ of OSC 21 is therefore positioned inwardly of the capture range Cr of the PLL circuit 22. Hence, VCO 22b performs the follow-up action when the PLL circuit 22 is in the locked state.

As a consequence, VCO 22b oscillates at the output frequency $f_2$ having a value equal to the output frequency $f_1$ of OSC 21 during the detection of the capacitance that is being received by the PLL circuit 22. A displacement quantity with respect to the initialized output frequency ($f_2$) (original freerunning frequency) appears in the freerunning frequency control voltage $v_2$ for keeping the follow-up action.

This freerunning frequency control voltage $v_2$ can be, because of the PLL circuit 22 being in the locked state, replaced as a displacement quantity of the output frequency $f_1'$ of OSC 21 during the detection of the capacitance with respect to the output frequency ($f_2$) (original freerunning frequency) possessed by VCO 22b. Further, the PLL circuit 22 maintains the follow-up action with respect to a fluctuation within the lock range Lr of the output frequency $f_1'$. This freerunning frequency control voltage $v_2$ therefore linearly changes for the fluctuation thereof.

Then, the fluctuation of the output frequency $f_1'$ is induced by a fluctuation of the stray capacitance that is being detected. Hence, when the PLL circuit 22 is in the locked state, the freerunning frequency control voltage $v_2$ linearly changes corresponding to fluctuation signal of the electric capacitance or the like (stray capacitance) detected by the sensor 26.

This freerunning frequency control voltage $v_2$ is also inputted to the analog output amplifier 23. A positive or negative voltage is therefore linearly outputted outside to the analog output signal $A_0$ corresponding to the fluctuation of the electric capacitance or the like (stray capacitance) that is being detected by the sensor 26. Further, in the output low-pass filter 24, the output voltage $v_3$ of a stable DC component is outputted by integrating an absolute value of an output voltage $V_1$ of the phase comparator 22a with a time constant larger than the loop filter 22c. Based on this output voltage $V_3$, the digital output circuit 25 executes binary processing, and 0 (0 volt) is therefore outputted as the digital output signal $D_0$ at this moment.

In the above-mentioned, referring to FIG. 3, there will be explained relative relations between the output frequency $f_2$ of VCO 22b during the detection of the variation in the stray capacitance, the lock range lr, the capture range Cr and the output frequencies $f_1 \rightarrow f_1'$ of OSC 21.

The output frequency before detecting the stray capacitance (before the variation) of OSC 21 is preset to $f_1$. Therefore, when the output frequency $f_1'$ varied due to the detection of the capacitance variation enters the capture range Cr, the PLL circuit 22 starts the action in the locked state. Consequently, there change the output voltage $v_1$ of the phase comparator 22a and the output voltage $v_2$ of the loop filter 22c. Accordingly, the initial output frequency $f_1$ of OSC 21 reversely undergoes an influence of the capacitance variation due to the changes in these output voltages $v_1$, $v_2$. Detected is whether or not the output frequency $f_1'$ at that time enters the capture range CR. As a result, an existence or non-existence of the capacitance variation is clearly distinguishable depending on an existence or non-existence of the digital output signal $D_0$.

Thereafter, if the output frequency $f_1'$ of OSC 21 is positioned inwardly of the lock range Lr of FIG. 3, the PLL circuit 22 continues the follow-up action in the locked state. Hence, the voltage that changes linearly corresponding to the variation quantity of the capacitance during the detection is outputted to the analog output signal $A_0$ due to the output voltage $v_2$ (freerunning frequency control voltage) of the loop filter 22c. If the variation disappears in the stray capacitance, OSC 21 returns to the output frequency $f_1$ initialized outwardly of the lock range Lr, and the PLL circuit 22 is put into the non-locked state. All reverts to the states before the detection.

Herein, the capture range Cr—i.e., a range that admits the input frequency $f_1'$ for transiting the PLL circuit 22 to the first locked state—is, as illustrated in FIG. 3, a frequency range narrower than the lock range Lr. This is attributed to the fact that the PLL circuit 22 exhibits a characteristics wherein the width of the capture range Cr is previously adjusted, and the width of the lock range Lr is automatically determined. Therefore, when the PLL circuit 22 is once brought into the locked state (stable state), VCO 22b performs the follow-up action stable for such a fluctuation of the received input frequency (output frequency $f_1'$ of OSC 21) as to fall within the variable power range (lock range Lr) where the output frequency $f_2$ is controllable and extend to the outside of the capture range Cr.

Besides, when comparing the initially received input frequency (output frequency $f_1$ of OSC 21) with the freerunning frequency ($f_2$), and even in this input frequency $f_1$ is substantially equal to an outer edge boundary frequency of the lock range Lr, this PLL circuit 22 has such a characteristic that it responds to only the capture range Cr narrower than the lock range Lr and is brought into the locked state. When transiting from the non-locked state to the locked state and vice versa, it proves that a hysteresis Lh shown in FIG. 3 exists between the two ranges Cr and Lr.

Accordingly, because of the existence of the hysteresis Lh, even though the input frequency $f_1$ is substantially equal to the outer edge boundary frequency of the lock range Lr, an unstable operation is not caused at all, and there is given a capability of being prepared with the detection of the variation in the stray capacitance invariably in the stable state.

In the above-stated detecting apparatus, for largely smoothly capturing the fluctuation signal of the electric capacitance or the like that is obtained from the sensor 26 and inputted via the input point In to OSC 21, a value of the capacitor $C_1$ of the CR component 21b is desirably set equal to or smaller than the range where the stray capacitance toe be detected changes. For instance, if the variation range of the stray capacitance that is detected from the sensor 26 is 10, the value of the capacitance component C of the capacitor $C_1$ is set to approximately 5.

When setting the above-mentioned value, however, both of the oscillation frequencies of OSC 21 and VCO 22b increase, and besides there may be a possibility wherein the variation range is too large enough to exceed the interior width of the capture range Cr. Then, it is desirable to set a value of the reserve time constant of the CR component 21b so that the fluctuation range of the output frequency $f_1'$ of OSC 21 which is concomitant with the detection of the variation in the stray capacitance is settled up to approximately 10% in terms of practicality. With this setting, for example, a change in the liquid level can be obviously detected by the sensor 26.

Further, in the case of observing whether or not a liquid level falls within a certain predetermined range when the output frequency $f_1$ of OSC 21 changes due to the fluctuation of the liquid level to be detected, a value of the capacitor $C_1$ of the CR component 21b is set to an adequate value, taking the variation capacitance into consideration. A width of the capture range Cr is adjusted beforehand, thereby making it possible to detect whether or not the liquid level falls within a constant range by use of the sensor 26.

The above-described method of detecting the detected result involves the steps of fetching the level detected in each state out of the analog output amplifier 23 and visually displaying it by driving a meter or the like in response to the analog output signal $A_0$ thereof. Further, the fact of an excess over the set reference level can be informed by operating a buzzer, etc. as an alarming sound in response to the digital output signal $D_0$ from the digital output circuit 25. If an electromagnetic valve or the like is in combination opened and closed in synchronization with the operation of such an informing means, the liquid level can be automatically kept constant. Note that in the case of keeping constant the liquid level, the control of water injection and drainage and also stoppage thereof is performed by utilizing the hysteresis Lh defined as a difference between the capture range Cr and the lock range Lr in the PLL circuit 22. Given, for instance, is a difference between a start timing of the water injection or drainage and a stop timing of the operation thereof. This intends to prevent the water injection and drainage from being executed frequently and provide the operation in a stable state.

At this time, the PLL circuit 22 has the characteristic that, as stated earlier, the width of the lock range Lr is automatically determined by previously adjusting the width of the capture range Cr. A width of the hysteresis Lh is thereby inevitably determined. Accordingly, the width of this hysteresis is settable corresponding to the timing difference between the respective operations in the example given above by properly selecting the width of the capture range Cr and the capacitor $C_1$ of the CR component 21b.

Incidentally, speaking of a configuration of the sensor 26, the shape and form of particularly the sensor unit do not become a subject of discussion on condition that they are adapted to capture the variation signal of the electric capacitance and transmit the signal electrically. In the detecting apparatus in the embodiment discussed above, a metal rod as small as a nail is employed as a sensor unit capable of detecting the liquid level of the water or the like contained in a container.

As described above, the sensor 26 is connected to OSC 21 including the time constant determining module, this sensor 26 serving to detect the variation in the electric capacitance or the like (stray capacitance) while being in contact or non-contact with the detected body. The freerunning frequency ($f_2$) of the PLL circuit 22 and the width of the capture range Cr are respectively set so that a varying range of the output frequency $f_1'$ of OSC 21 extends (enters) to the inside of the capture range Cr of the PLL circuit 22, this output frequency being determined by the synthetic time constant obtained by adding up the variation value of the electric capacitance or the like (stray capacitance) detected by the sensor 26 and the reserve time constant preset by the time constant determining module in the PLL circuit 22 connected to this OSC 21. The state variation of the detected body is detected by detecting the change in the control voltage $v_2$ of the freerunning frequency of VCO 22b that is caused with the variation in the electric capacitance or the like (stray capacitance) detected by the sensor 26.

EMBODIMENT 2

Next, a second embodiment of the present invention will be described. In the previously explained method of detecting the variation in the electric capacitance or the like (stray capacitance), whether or not the capacitance variation extends to a certain constant range in the whole variation range of the electric capacitance or the like detected by the sensor 26 by arbitrarily adjusting the width of the capture range CR of the PLL circuit 22.

In accordance with the second embodiment, only the width of the capture range Cr of the PLL circuit 22 is previously arbitrarily adjusted and set within such a range as to exert no influence on the various operations thereof. Detected is whether or not the output frequency $f_1'$ of OSC 21 which changes when detecting the variation in the stray capacitance exists inwardly of the arbitrarily set capture range Cr. With this detection, there is detected the fact that the change in the electric capacitance or the like (stray capacitance) detected by the sensor 26 extends to a given range in the whole range of the variation thereof.

Figure 4:
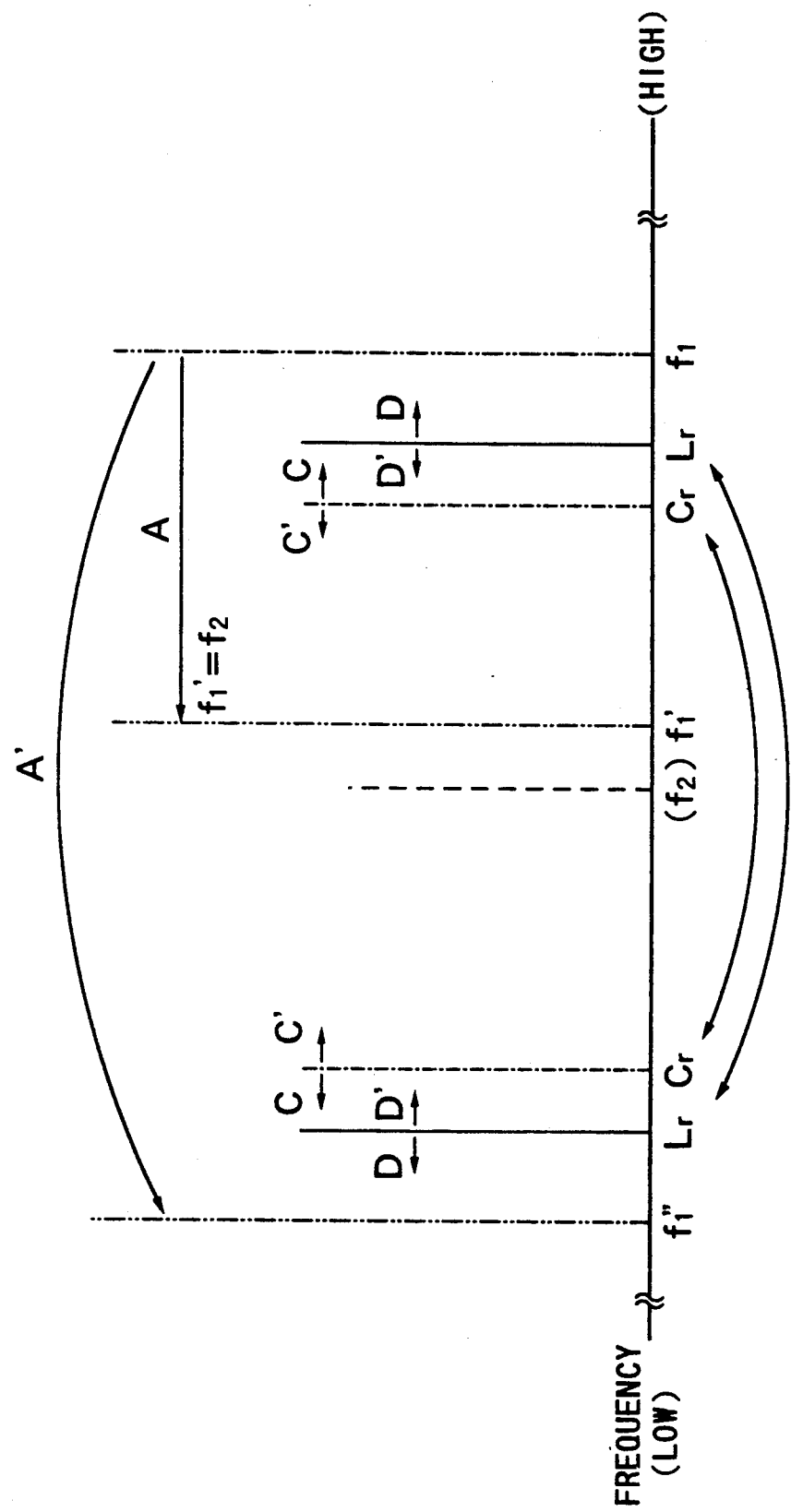
FIG. 4 is a graphical depiction of the lock range and capture range in an embodiment of the present invention.

The content shown above will be described in greater detail. The construction of the detecting apparatus itself, which is the same as that of FIG. 1, may suffice. FIG. 4 is a diagram of assistance in explaining the principle to detect the fact that the variation in the stray capacitance at which the invention claimed in claim 2 aims extends to a given range. The symbols in the FIGURE are the same as those in FIG. 3. However, an arrow C indicates a direction in which the capture range is expanded, while an arrow C' indicates a direction in which the lock range Lr is narrowed. Further, an arrow D indicates a direction in which the lock range Lr is expanded, while an arrow D' indicates a direction in which the lock range Lr is narrowed.

According to the invention as illustrated in FIG. 4, in the range where the detectable stray capacitance changes, i.e., in the specified area of the whole variation range (arrow A') from the output frequency $f_1$ of OSC 21 before the stray capacitance changes to the output frequency $f_1''$ after the change in the stray capacitance has been detected during the detection of the capacitance, for instance, the middle-of-variation output frequency $f_1'$ indicated by an arrow A is set to match with the lock range Lr having a width enough to include the capture range Cr of the PLL circuit 22. Whereas in other variation areas, this frequency is set to mismatch therewith.

Further, the width of the capture range Cr of the PLL circuit 22 is previously arbitrarily adjusted within such a range as to exert no influence on the various operations of the PLL circuit 22 by altering the characteristics possessed by the loop filter 22c or effecting a level adjustment by use of a variable resistor or altering the oscillation characteristics of VCO 22b. Herein, both the capture range Cr and the lock range Lr have widths spreading uniformly towards the higher and lower frequencies, with the output frequency ($f_2$) (freerunning frequency) of VCO 22b being centered. It is therefore feasible to adjust the width of the capture range Cr in an arrowed direction C or C' in bilateral symmetry with respect to the freerunning frequency. Besides, the width of the lock range Lr is, as previously explained, automatically determined by the characteristics of the PLL circuit 22 when determining the width of the capture range Cr. More specifically, the lock range Lr is adjusted in a direction D or D'. The lock range Lr is, though a variation rate thereof is not necessarily the same, adjusted in the same direction in synchronization with a change in the capture range Cr in bilateral symmetry with respect to the freerunning frequency.

Note that in the area specified by determining the width of the capture range Cr, a point (critical point) at which the a variation in the capacitance is detected at first is a location where the output frequency $f_1'$ of OSC 21 is going to be positioned inwardly of the capture range Cr. A point (limit point) when reverting to the home position after finishing the detecting is a location where the output frequency of OSC 21 is positioned outwardly of the lock range Lr. Hence, the PLL circuit 22 is set in the non-locked state just when finishing the detection so that the output frequency $f_1$ of OSC 21 before detecting the capacitance is certainly positioned outwardly of the lock range Lr at a stage of initialization. Further, when adjusting the width of the capture range Cr by altering the oscillation characteristics of VCO 22b, and if the oscillation characteristics are not altered to keep a balance of bilateral symmetry with respect to the freerunning frequency ($f_2$), it is impossible to obtain a linear variation in the analog output signal $A_0$. Attention has to be paid to this as well as to the above-stated initialization.

Thus, the width of the capture range Cr is adjusted by expanding or narrowing this width, thereby making it possible, in the case of detecting a change in, e.g., the liquid level, to detect whether or not the liquid level falls within a constant range on condition that a value of the capacitor $C_1$ of the component 21b is set to a proper value for the variation capacitance in the range wherein the output frequency $f_1$ of OSC 21 changes, as indicted by the arrow A' shown in FIG. 4, from $f_1$ to $f_1''$ due to the fluctuation in the liquid level that is detected from the sensor 26. This detected result is outputted to outside by using the analog output signal $A_0$ and the digital output signal $D_0$, and an electromagnetic valve or the like is opened and closed, thereby controlling the liquid level. The liquid level can be thus kept constant.

As discussed above, the width of the capture range Cr of the PLL circuit 22 is arbitrarily adjusted. It is possible to detect whether or not the variation in the electric capacitance or the like (stray capacitance) that is detected by the sensor 26 extends to a given preset range.

EMBODIMENT 3 .

Herein, the embodiment intends to detect a variation state of the electric capacitance or the like by detecting whether or not the output frequency $f_1'$ of OSC 21 concomitant with the change in the capacitance varies towards the outside of the lock range Lr of the PLL circuit 22, wherein the freerunning frequency ($f_2$) of VCO 22b of the PLL circuit illustrated in FIG. 1 is set inside the capture range Cr by previously matching with the output frequency $f_1$ of OSC 21 and so on.

The invention in the third embodiment is based on a conception opposite to the precedent invention in the first embodiment. The output frequency ($f_2$) (freerunning frequency) of VCO 22B of the PLL circuit 22 is set inside the capture range Cr by previously matching with the output frequency $f_1$ of OSC 21. With this arrangement, before detecting the variation in the stray capacitance, the PLL circuit of this detecting apparatus is put into the locked state. Then, with the fluctuation signal of the stray capacitance that is obtained from the sensor 26, the output frequency $f_1'$ of OSC 21 changes to deviate from the width of the lock range Lr of the PLL circuit 22. Varied also is the control voltage $v_2$ of the freerunning frequency of the PLL circuit 22 which follows up this action. Accordingly, a variation quantity of the stray capacitance is detected from a voltage difference between the varied control voltage $v_2$ and the control voltage of the freerunning frequency when the change in the capacitance is not detected.

According to the invention of the third embodiment, however, in other words, the initial state of this detecting apparatus is set so that the output frequency $f_1'$ of OSC 21 during the detection of the capacitance deviates from the width of the lock range Lr of the PLL circuit 22. With this setting, the PLL circuit 22 which has been in the locked state when the change in the capacitance was not detected shifts to the non-locked state when detecting the change in the capacitance. Detected accordingly are the variation appeared in the output voltage $v_1$ of the phase comparator 22a depending on whether the PLL circuit 22 is in the locked state or not and an existence or non-existence of the variation in the stray capacitance by detecting the output voltage $v_2$ of the loop filter 22c that is generated based thereon, i.e., the control voltage of the freerunning frequency.

Figure 5:
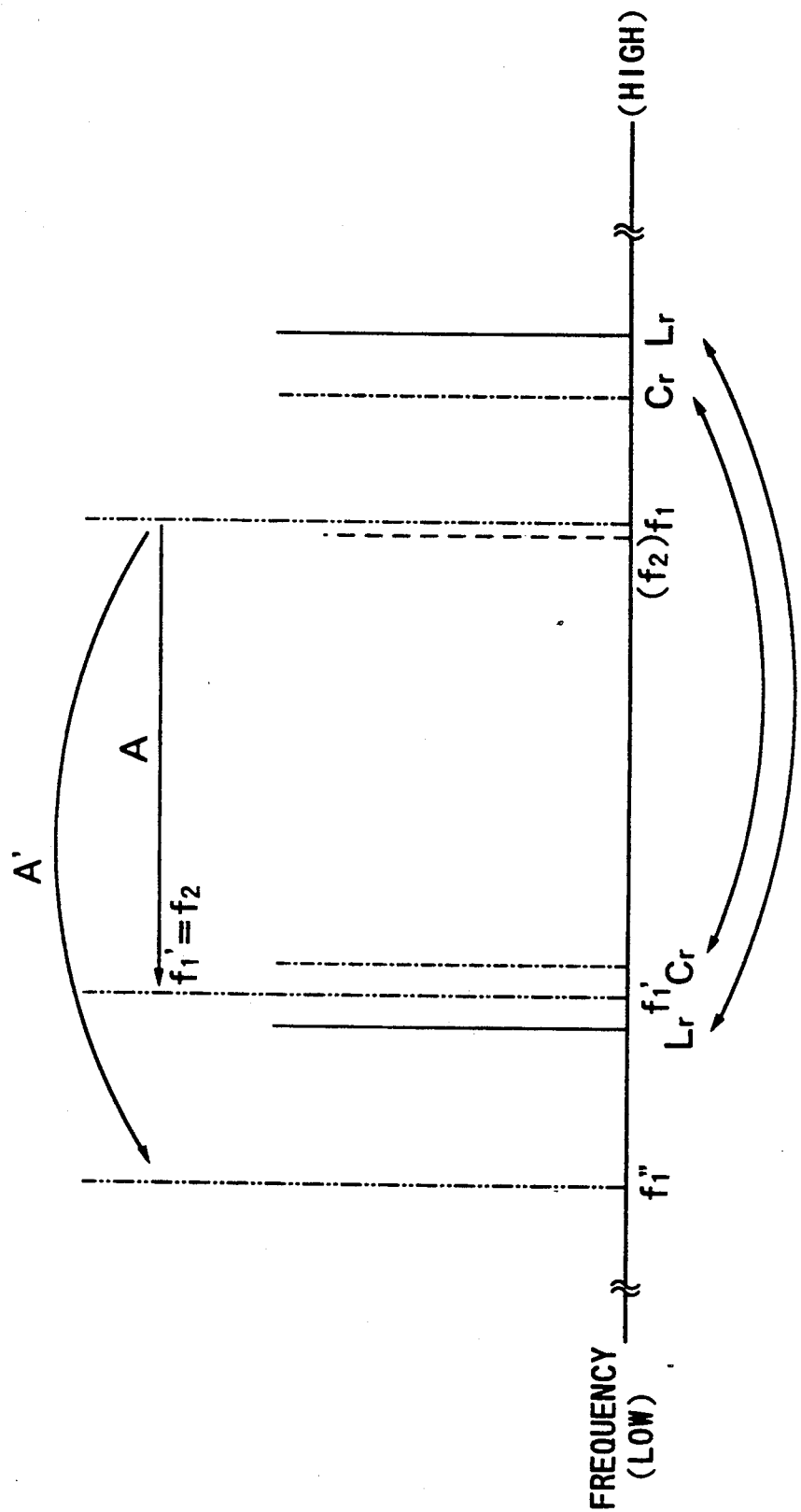
FIG. 5 is a graphical depiction of the lock range and capture range in a further embodiment of the present invention.

The detecting apparatus in the third embodiment, which is the same as that of FIG. 1, may also suffice. Further, FIG. 5 demonstrates the principle on which the variation in the stray capacitance can be detected according to the invention claimed in claim 3. Note that the symbols in FIG. 5 are identical with those in FIG. 3. Set according to the invention in the embodiment 3 are, as illustrated in FIG. 5, the output frequency $f_1$ of OSC 21 before detecting the change in the stray capacitance and the output frequency $f_1'$ after detecting the change in the stray capacitance or the output frequency $f_1''$. Then, the PLL circuit 22 is previously brought into the locked state by matching the output frequency $(f_2)$ (freerunning frequency) of VCO 22b of the PLL circuit 22 with the output frequency $f_1$ of OSC 21 before detecting the variation in the capacitance, thus making a preparation with the detection of the change in the stray capacitance.

In this state, for instance, if the output frequency $f_1$ of OSC 21 changes to $f_1'$ indicted by the arrow A after detecting the variation in the capacitance, this frequency $f_1'$ is positioned inwardly of the lock range Lr. Therefore, the PLL circuit 22 retains the locked state and oscillates by causing the output frequency $f_2$ of VCO 22b to follow up the output frequency $f_1'$ of OSC 21. At this moment, a voltage difference with respect to the control voltage of the freerunning frequency in the initial state appears in the control voltage $v_2$ of the freerunning frequency. This, however, linearly corresponds to the fluctuation signal of the electric capacitance or the like (stray capacitance) that is obtained from the sensor 26. Therefore, the variation quantity of the stray capacitance is detectable from this voltage difference.

On the other hand, if the output frequency of OSC 21 changes as indicated by the arrow A' and becomes the output frequency $f_1''$, this frequency $f_1''$ is out of the width of the lock range Lr. Therefore, the PLL circuit 22 comes into the non-locked state. The output frequency of VCO 22b turns out to be $(f_2)$, viz., the freerunning frequency, resulting in a state (0-state) of having no control voltage of the freerunning frequency. In this non-locked state, alternately the positive and negative output voltages $v_1$ of the phase comparator 22a are substantially constantly generated. On the basis of this, an indication of whether or not this PLL circuit is in the locked state is apparently outputted to the digital output signal $D_0$ of the digital output circuit 25 via the output low-pass filter 24. Hence, it is feasible to detect the existence or non-existence of the variation in the stray capacitance by detecting the output signal $D_0$. In the embodiment illustrated in FIG. 5, the PLL circuit 22 is in the locked state in the initial state before detecting the variation in the stray capacitance. The digital output signal $D_0$ of the detecting apparatus at this moment is always 0 (0 volt) reversely to the precedent first embodiment. Further, in this initial state, the output frequency $(f_2)$ (freerunning frequency) of VCO 22B is also matched with the output frequency $f_1$ of OSC 21, resulting in a state (0-state) where there is almost no control voltage of this freerunning frequency. As a consequence of this, the analog output signal $A_0$ also indicates almost 0 (0 volt).

As discussed above, the invention claimed in claim 3 which has been described in the third embodiment intends to detect the existence or non-existence of the state variation of the detected body. This detection involves the steps of previously setting the freerunning frequency $(f_2)$ of the PLL circuit 22 in the intra capture range Cr state by matching it with the output frequency $f_1$ of OSC 21, bringing the PLL circuit 22 beforehand into the locked state and detecting the output frequency $f_1'$ of OSC 21 that changes to deviate from the width of the lock range Lr of the PLL circuit 22, the output frequency $f_1'$ being generated with the change in the electric capacitance or the like that is detected by the sensor 26.

EMBODIMENT

The gist of the invention of the fourth embodiment is to find out increase/decrease directions of the electric capacitance and magnitudes thereof from the variation (deviation quantity) in the control voltage of the freerunning frequency that is concomitant with the capacitance change at that time by presetting the conditions so that the PLL circuit 22 constantly retains the locked state of the two states after and before causing the variation in the electric capacitance.

Figure 6:
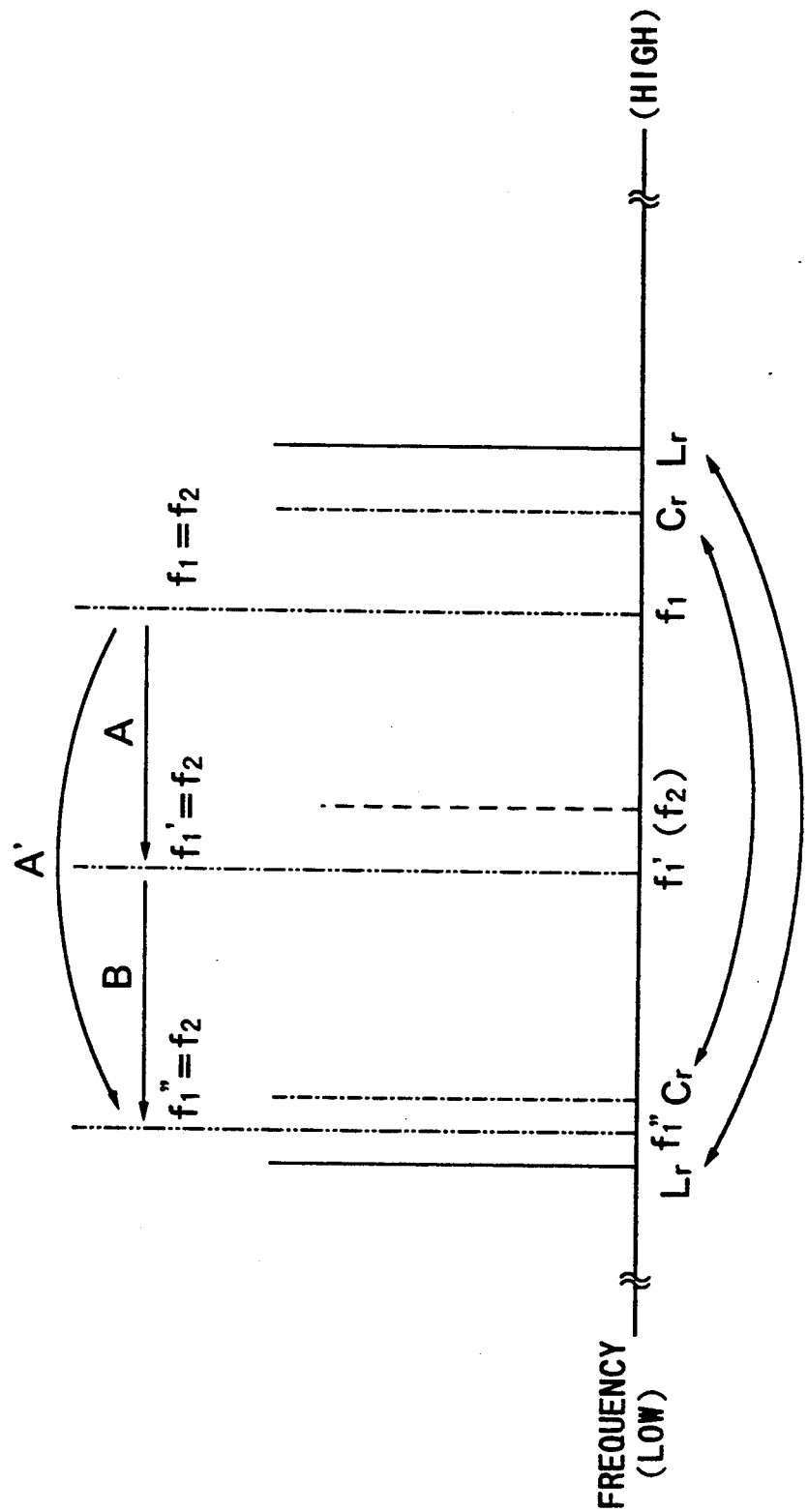
FIG. 6 is a graphical depiction of the lock range and capture range in yet a further embodiment of the present invention.

In this embodiment also, the fundamental construction of the detecting apparatus which is the same as that of FIG. 1 may suffice. FIG. 6 demonstrates the principle to detect the variation in the stray capacitance in the invention of claim 4. The symbols in FIG. 6 are the same as those in FIG. 3.

Set within the width of the capture range Cr according to this invention are both of the output frequency $f_1$ of OSC 21 before detecting the variation in the stray capacitance and the output frequency $f_1'$ of OSC 21 in which the variation in the stray capacitance has been detected. Alternatively, if the output frequencies f based on the detection of the variation in the stray capacitance change as indicated by the arrows A' and B, the initial state of this detecting apparatus is preset so that the output frequency $f_1''$ of OSC 21 at that moment is settled inwardly (inside) of the width of the lock range Lr.

With this initialization, the PLL circuit 22 of the detecting apparatus perpetually retains the locked state with respect to the variation range allowably by the output frequency $f_1$ of OSC 21, i.e., the entire area of the range where the variation in the stray capacitance is detectable. Then, the control voltage of the output frequency ($f_2$) of VCO 22b, i.e., the control voltage $v_2$ of the freerunning frequency is varied in the form corresponding to the variation quantity of the above-mentioned capacitance upon receiving the fluctuation signal of the stray capacitance that is obtained from the sensor 26. It follows that a linear voltage change corresponding thereto is outputted also to the analog output signal $A_0$.

Figure 7:
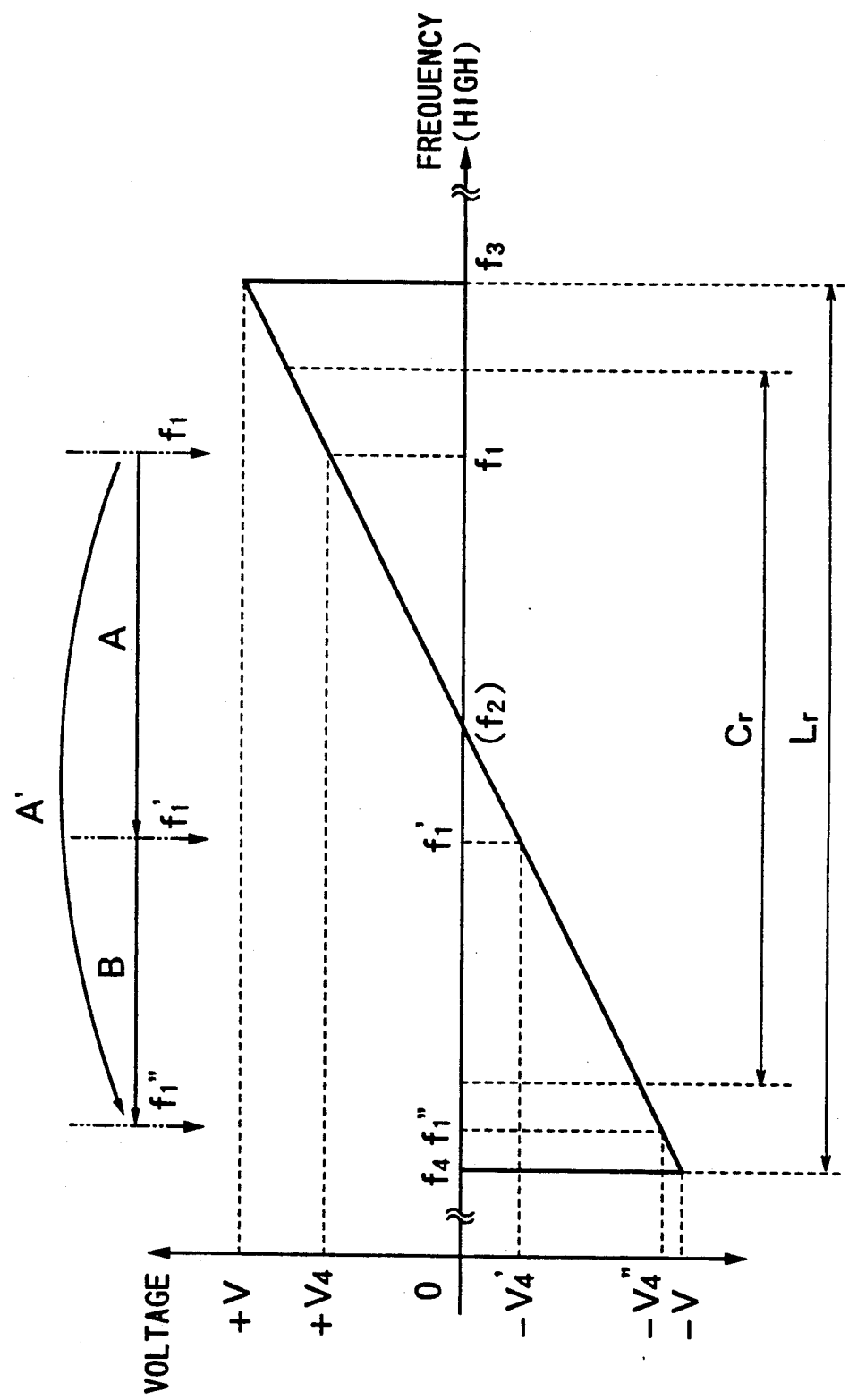
FIG. 7 is a graphical depiction of the relationship between voltage output and lock range frequency limits in an embodiment of the present invention.

FIG. 7 is a diagram showing a relation between the variable range of the voltage output of the analog output signal $A_0$ and upper and lower limit frequencies in the lock range Lr. The symbols in FIG. 7 are identical with those in FIG. 6. However, $f_3$ represents an upper limit frequency of the lock range Lr; $f_4$ denotes a lower limit frequency; and particularly $+v_4$, $-v_4'$, $-v_4''$ indicate voltages of the analog output signals $A_0$ which correspond to the respective output frequencies $f_1$, $f_1'$, $f_1''$ of OSC 21 of the detecting apparatus that are set in the preceding FIG. 6.

In accordance with a fourth embodiment, as illustrated in FIG. 7, if there is the output frequency $f_1$ of OSC 21 when the variation in the capacitance is not detected, $+v_4$ is outputted to the analog output signal $A_0$. Then, when the variation in the capacitance is detected, and if, for example, the output frequency $f_1$ of OSC 21 changes to $f_1'$ indicated by the arrow A, the follow-up action is performed in the PLL circuit 22. Hence, the control voltage of the freerunning frequency of VCO 22b varies, whereby $-v_4'$ is, as shown in the FIGURE, outputted to the analog output signal $A_0$.

Further, when the variation in the capacitance is detected, and even if, for instance, the output frequency $f_1$ of OSC 21 changes to the frequency $f_1''$ indicated by the arrow A' or B, the varied output frequency $f_1''$ is located inwardly of the lock range Lr possessed by the PLL circuit 22. Therefore, $-v_4''$ shown in FIG. 7 is outputted to the analog output signal $A_0$ in a stable state.

Accordingly, the variation in the capacitance is detected in accordance with the voltage difference of the analog output signal $A_0$ generated based on the control voltage of the freerunning frequency of VCO 22b. Besides, a relation between the variation thereof and the output assumes a linearity. For this reason, if a difference between the output voltages with respect to the entire area of the capacitance variation is measured beforehand, the variation quantity itself can be judged. It is also possible to simultaneously detect the increase/decrease directions of the stray capacitance and the magnitudes thereof. According to the method of informing the detected results, as in the same way with the above-stated embodiment, a meter or the like is connected to the analog output signal $A_0$, whereby the whole situation of the state variations of the detected body can be visually displayed.

Herein, as in the case of the output frequency $f_1''$ of OSC 21 that is illustrated in FIG. 7, when in a state where this output frequency $f_1''$ is located inwardly of the lock range Lr of the PLL circuit 22 but outwardly of the capture range Cr, and, for some reason, if there is cut off a power supply for supplying the power for practicing this detecting method, the capacitance of the detected body is constant irrespective of the disconnection of the power supply even in the case of restoring the power supply afterwards. Therefore, the output frequency $f_1''$ of OSC 21 is also invariably positioned the same, i.e., outwardly of the capture range Cr. This leads to a defectiveness in the continuous detection of the capacitance. Required in such an instance is an attached circuit called a [kick circuit] for instantaneously forcibly putting the output frequency $f_1''$ of OSC 21 into the interior of the capture range Cr. An insertion of this attached circuit spoils the facility that is characteristic of the method according to the present invention. In this invention, the output frequencies f of OSC 21 for the entire area of the capacitance variations of the detected body is set inwardly of the capture range Cr at the stage of initialization. The practical facility can be thereby maintained against the situation described above.

As discussed above, with respect to the control voltage of the freerunning frequency of the PLL circuit 22, it is feasible to find out the increase/decrease directions of the electric capacitance or the like and the magnitudes thereof detected by the sensor 26 by detecting a deviation quantity between the voltage before the electric capacitance changes and the voltage when detecting the change in the electric capacitance.

EMBODIMENT 5

Next, a fifth embodiment will be explained. Further, the fifth embodiment is based on relations with other embodiments with respect to the method of detecting the variation in the electric capacitance or the like (stray capacitance, etc) which has already been described by way of one example of the embodiments of the inventions claimed in claims 1 through 3.

According to the invention, when the PLL circuit 22 shifts from the non-locked state to the locked state and vice versa, the hysteresis Lh possessed by the PLL circuit 22 and existing between the width of the capture range Cr and the width of the lock range Lr is made to properly correspond to a difference between the detection levels during an increase and a decrease of the electric capacitance or the like, the difference being detected by the sensor 26. Two states of the detected body (stray capacitance) are thereby detected.

Figure 8:
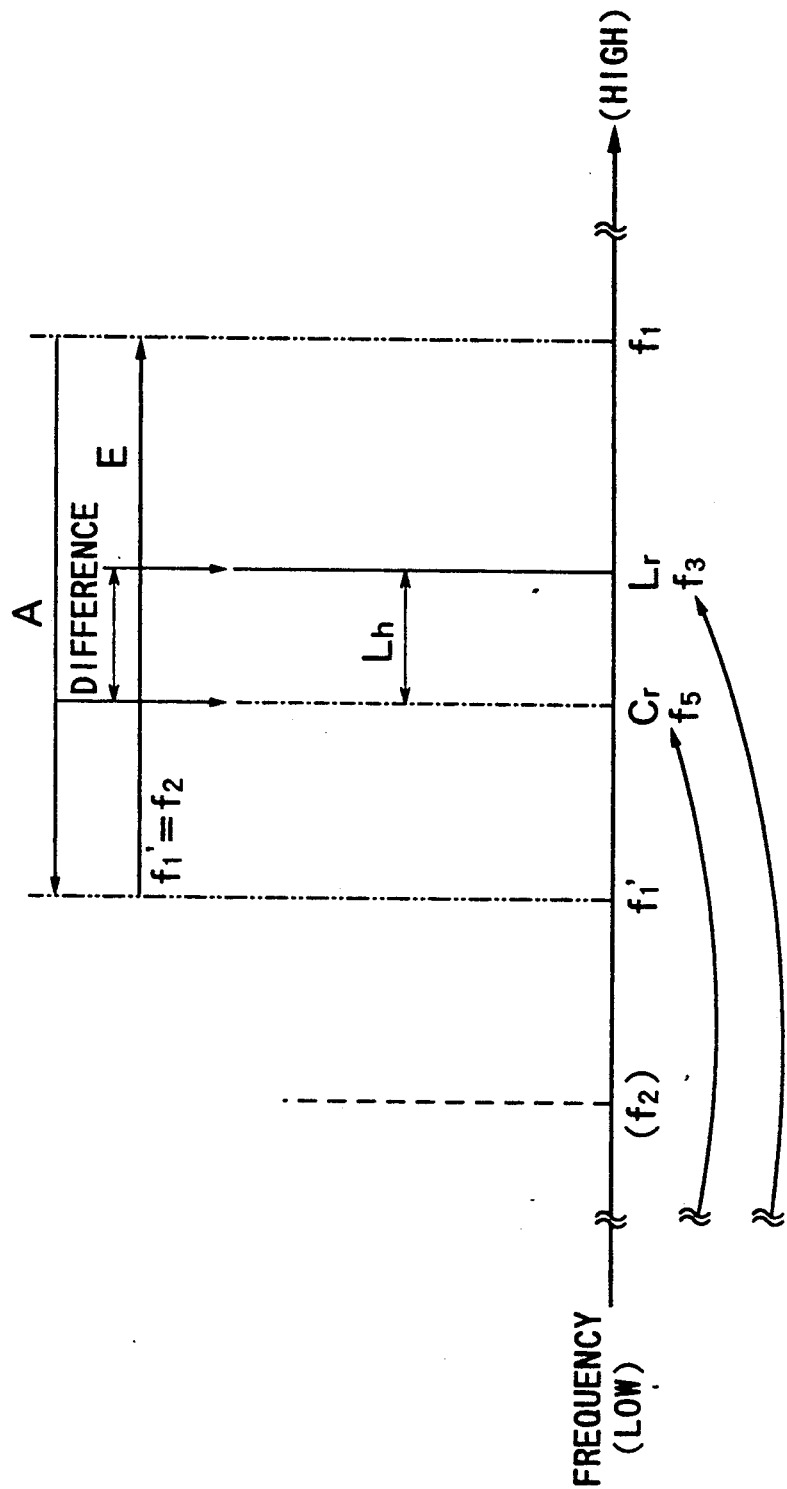
FIG. 8 is a graphical depiction of detection of the variation of stray capacitance in an embodiment of the present invention.

The basic detecting apparatus for the fifth embodiment of invention is the same as that shown in FIG. 1. FIG. 8 is a diagram of assistance in explaining the principle to detect the variation in the stray capacitance according to the invention. The symbols in the FIGURE are identical with those in FIG. 7. However, $f_5$ represents an upper limit frequency of the capture range Cr; and an arrow E indicates a direction in which the frequency varies. Note that in FIG. 8, for convenience, the lock range Lr and the capture range Cr are both illustrated only in the vicinity of the upper limit frequency.

As depicted in FIG. 8, an area of the hysteresis exists between the lock range Lr and the capture range Cr. Therefore, when the output frequency f of OSC 21 before causing a variation the stray capacitance changes from $f_1$ to the output frequency $f_1'$ with the change in the stray capacitance, the upper limit frequency $f_5$ of the capture range Cr becomes a critical frequency enough to shift the PLL circuit of the detecting apparatus from the non-locked state to the locked state. Further, when the output frequency $f_1'$ of OSC 21 during the detection of the change in the capacitance returns to the output frequency $f_1$ of OSC 21 before detecting the change in the capacitance, the upper limit frequency $f_3$ of the lock range Lr becomes a limit frequency capable of shifting the PLL circuit from the locked state to the non-locked state. Hence, a difference is, as a matter of course, caused in the control voltage $v_2$ of the freerunning frequency of VCO 22B between the time when the output frequency f of OSC 21 changes in the arrowed direction A and the time when the same frequency returns in the arrowed direction E. A difference is also produced in the output voltage $v_1$ of the phase comparator 22a.

Namely, this implies that a difference is caused between a detection critical point (detection start point) at which the variation in the stray capacitance becomes detectable and a detection limit point (detection end point) at which the detection becomes impossible. Therefore, if a change (bidirectional change) in increase/decrease reversibility is caused in the state of the detected body (stray capacitance), this appears as a detection level difference between the detection during the increase and the detection during the decrease. Then, this detection level difference is induced by the above-stated hysteresis Lh.

The fifth embodiment is arranged to make it possible to surely detect two states (two levels) of the detected body (stray capacitance) while paying the attention to the hysteresis.

Figure 9:
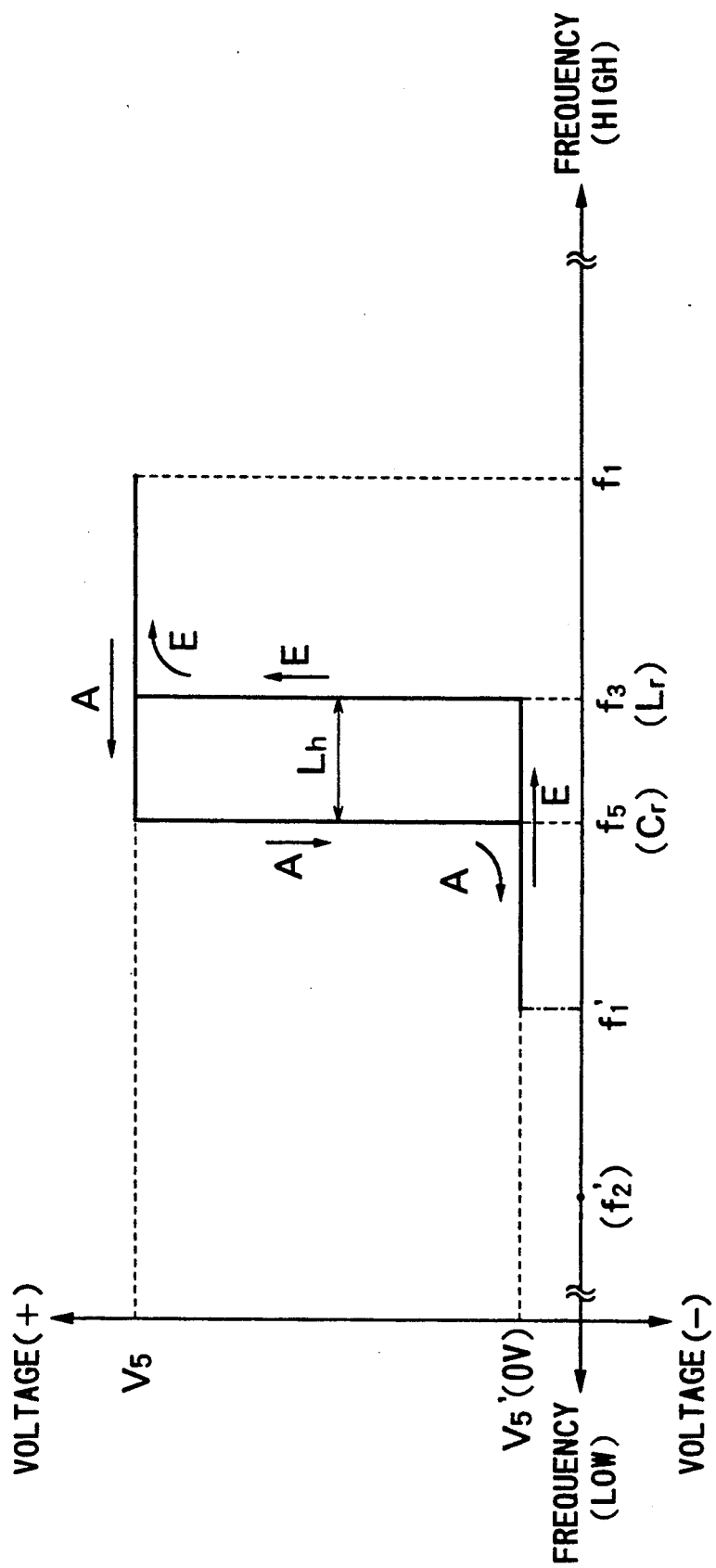
FIG. 9 is a graphical depiction of the variation of the voltage of the output signal in an embodiment of the present invention.

FIG. 9 is a diagram of assistance in explaining a variation state of the digital output signal $D_0$ of the digital output circuit 25 that is eventually generated via the output low-pass filter 24 on the basis of the control voltage $f_2$ of the freerunning frequency conceived as a determining element of the output frequency $f_2$ of VCO 22b and the output voltage $v_1$ based on a comparison between the output frequency $f_2$ and the output frequency $f_1'$ in the phase comparator 22a. The symbols in FIG. 9 are the same as those in FIG. 6. However, $v_5$ and $v_5'$ represent voltages of the digital output signal $D_0$.

As illustrated in FIG. 9, the output frequency $f_1$ of OSC 21 when no variation in the capacitance is detected changes to the output frequency $f_1'$ with a detection of the capacitance variation. Just then, as indicated by the arrow A, the voltage of the digital output signal $D_0$ changes from $v_5$ to $v_5'$ (0 volt). This change is caused with a border defined by the upper limit frequency $f_5$ of the capture range Cr. At this point of time, the PLL circuit 22 is brought into the locked state. Then, when the output frequency $f_1'$ of OSC 21 that is detecting the variation in the capacitance returns again to the output frequency $f_1$ when there is no change in the capacitance, as indicated by the arrow E, the voltage of the digital output signal $D_0$ changes from $v_5'$ to $v_5$ (constant voltage). During this return, however, a change in the voltage of the digital output signal $D_0$ is caused with a border defined by the upper limit frequency $f_3$ of the lock range Lr. At this point of time., the PLL circuit 22 comes into the non-locked state. As can be understood from FIG. 9, when the output frequency f of OSC 21 changes from $f_1$ to $f_1'$ (or from $f_1'$ to $f_1$), the value of the output frequency f has a hysteresis characteristic.

Hence, the invention intends to prevent the water injection and drainage from being frequently performed and effect the operations in the stable state. This involves the step of providing differences between the water injection and drainage control operations and between stop control timings of the respective operations in the case of keeping constant the two states of the detected body, e.g., the liquid levels in a water tank. Incidentally, in this state, the fact of approaching the control timing of the water injection and drainage operations can be also visually confirmed by a meter or the like connected to the analog output signal $A_0$ of the detecting apparatus. It should be also noted that when making the hysteresis Lh possessed by the PLL circuit 22 corresponding to the level difference of the detected body, the two states of the detected body are detectable more surely than before by adequately setting the initial state of the detecting apparatus in terms of considering a ratio at which the width (area) of the hysteresis Lh occupies a portion versus the entire area of the capacitance variation before detecting the capacitance variation and when detecting the capacitance variation.

As discussed above, the invention aims at detecting the two states of the detected body by properly making a difference (hysteresis)—the difference between the value at the detection critical point capable of detecting the variation in the electric capacitance or the like and the value at the detection limit point incapable of detecting the variation in the electric capacitance or the like—corresponding to a detection level difference during the increase and decrease of the electric capacitance or the like that is detected by the sensor 26.

EMBODIMENT 6

Next, a sixth embodiment will be described. The first to fifth embodiments explained earlier have the following arrangement. The sensor 26 for detecting the change in the stray capacitance in contact or non-contact with the detected body is connected to OSC 21 including the time constant determining module. The state variation of the detected body is detected in the range to which the variation in the output frequency $f_1'$ extends, this output frequency being determined by the synthetic time constant obtained by adding up the variation value of the electric capacitance or the like (stray capacitance, etc) that is detected by the sensor 26 and the time constant preset in the time constant determining module. Namely, when the output frequency $f_1'$ of OSC 21 changes with respect to the freerunning frequency ($f_2$) of the PLL circuit 22, the control voltage $v_2$ of the freerunning frequency ($f_2$) of the PLL circuit 22 fluctuates. The variation in the stray capacitance is therefore detected by detecting this control voltage $v_2$.

The invention of the sixth embodiment is, however, constructed to detect the variation in the stray capacitance. This requires the steps of fixing, as stated on the fundamental principle of the PLL circuit, the output frequency f of OSC 21, causing the freerunning frequency ($f_2$) itself of the PLL circuit 22 to transit with the fluctuation in the stray capacitance that is obtained from the sensor 26 and detecting a fluctuation in the control voltage $v_2$ of the freerunning frequency of the PLL circuit at that time.

Figure 10:
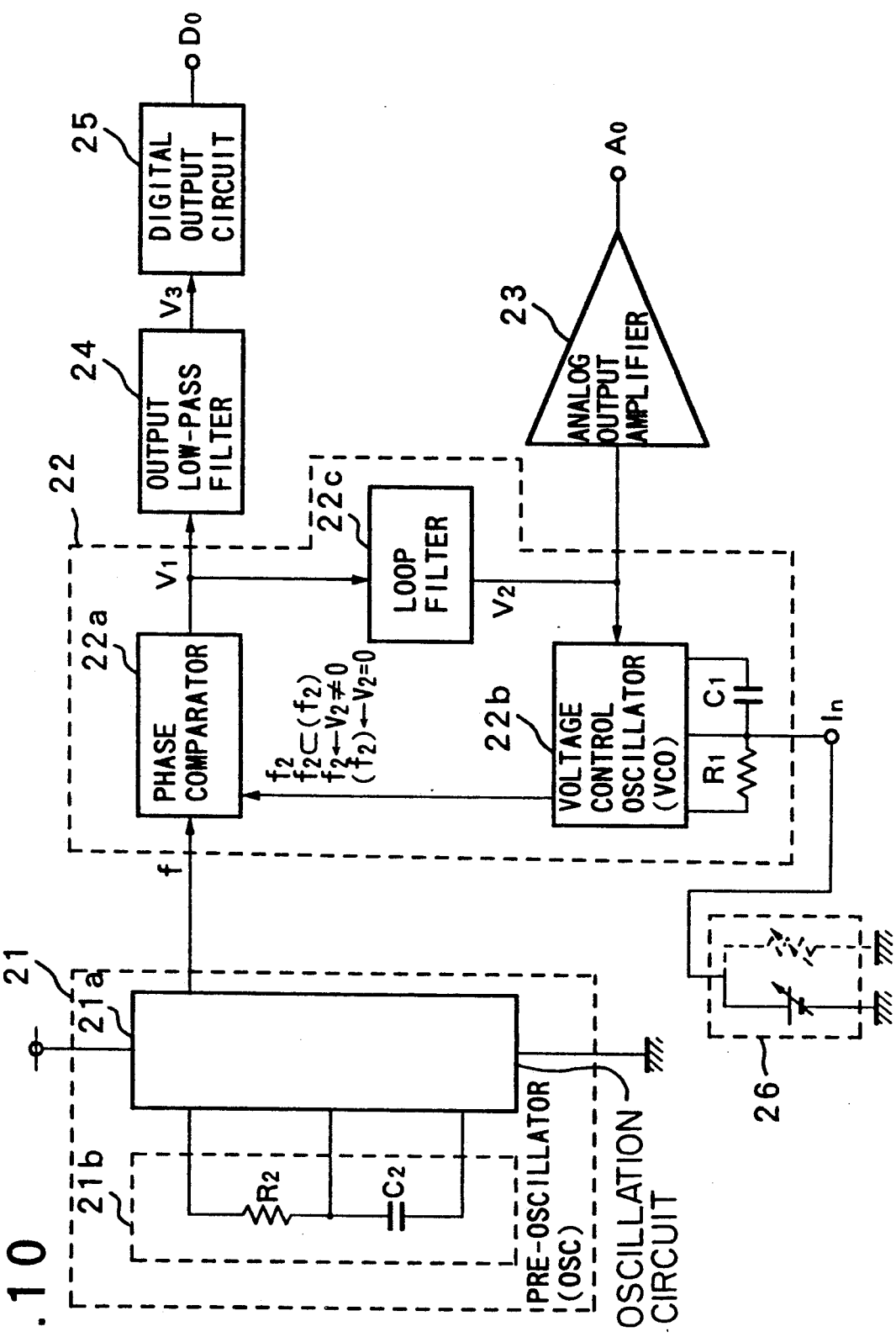
FIG. 10 is a block diagram of a further embodiment of the present invention.

FIG. 10 is a functional block diagram showing an embodiment of construction of the principal portion of the detection module in the detecting apparatus used for practicing the method of detecting the variation in the stray capacitance according to the invention of claim 6. The symbols in the FIGURE are identical with those in FIG. 1. As obvious from FIG. 10, the sensor 26 is connected to a reserve time constant determining block provided in VCO 22b within the PLL circuit 22 and consisting of a resistor $R_1$ and a capacitor $C_1$, this block serving to determine the output frequency ($f_2$) (freerunning frequency). Then, a variation value (fluctuation signal) of the stray capacitance that is obtained from the sensor 26 is added by the reserve time constant determining block, thereby forming a synthetic time constant. The freerunning frequency ($f_2$) itself transits in accordance with the fluctuation signal. Accordingly, OSC 21 in this embodiment oscillates at an intrinsic frequency in accordance with a time constant determined by the CR component 21b. The fixed output frequency f is received by the PLL circuit 22.

In the PLL circuit 22, as previously motioned, the capture range Cr and the lock range Lr are determined based on the output frequency ($f_2$) (freerunning frequency) of VCO 22b. In this embodiment, however, when detecting the capacitance variation, the freerunning frequency ($f_2$) itself transits with an input of a signal indicating the fluctuation in the stray capacitance that is obtained from the sensor 26. Simultaneously, the capture range Cr and the lock range Lr thereby concomitantly transit.

The phase comparator 22a makes a real-time comparison between phases of the intrinsic output frequency f of OSC 21 and of the transiting output frequency ($f_2$) (freerunning frequency) of VCO 22b, and various operations of the PLL circuit 22 are then executed. When the capture range Cr transits up to a state where the intrinsic output frequency f of osc 21 can be taken in (included), this PLL circuit 22 comes into the locked state.

Figure 11:
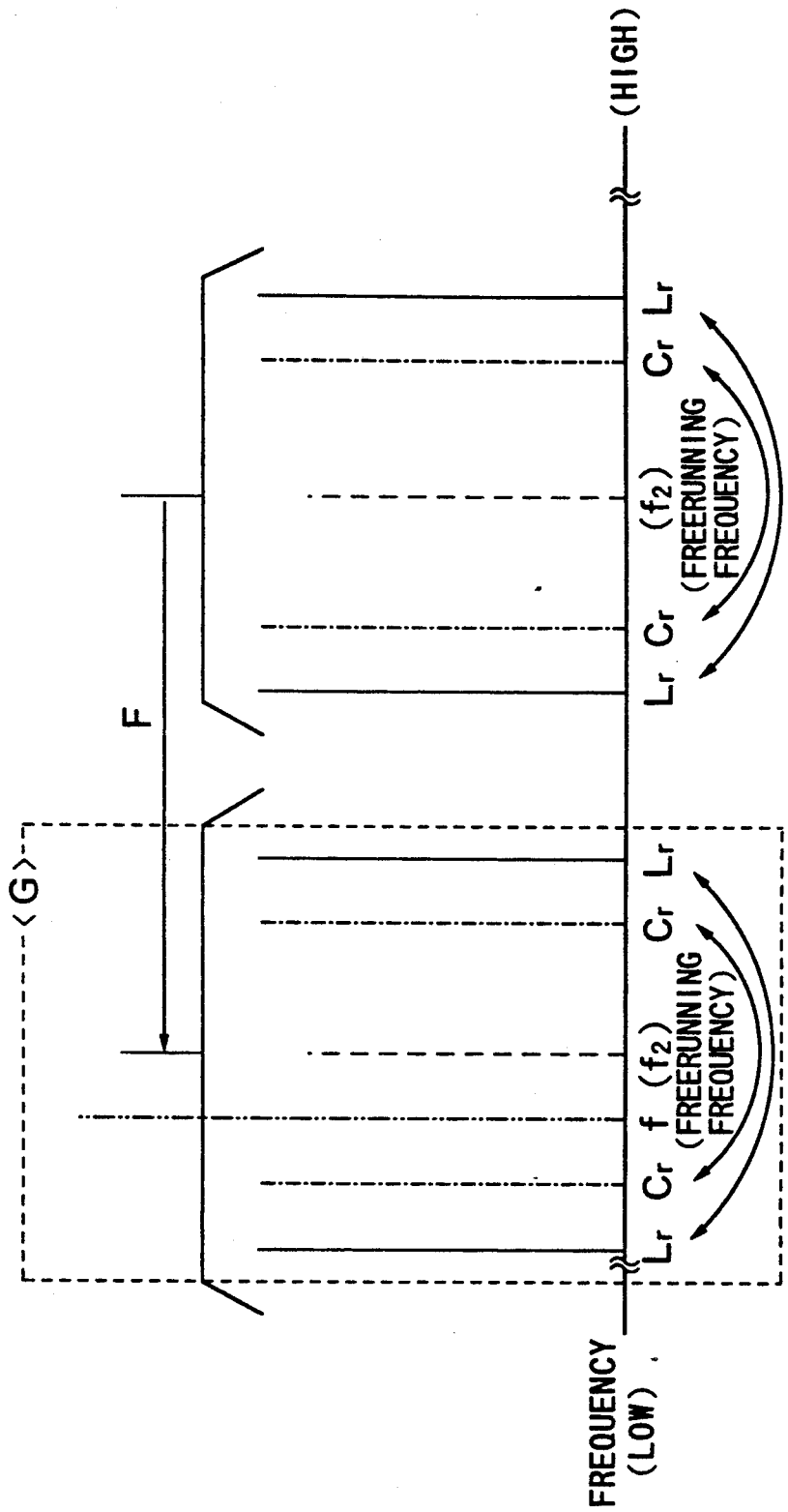
FIG. 11 is a graphical depiction of detection of the variation of stray capacitance in the embodiment of FIG. 10.
Figure 12:
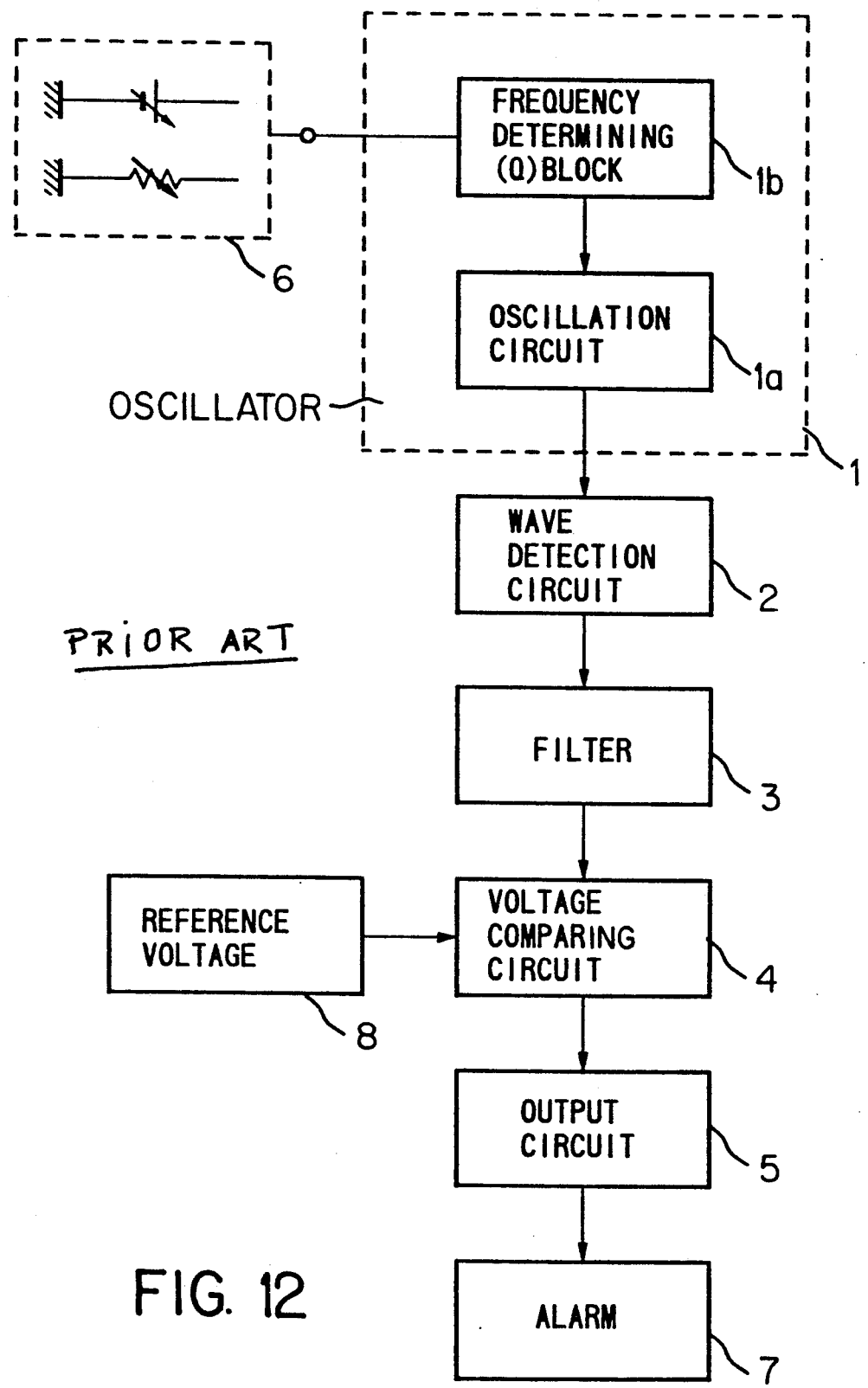
FIG. 12 is a block diagram of a prior art system for detecting stray capacitance.
Figure 13:
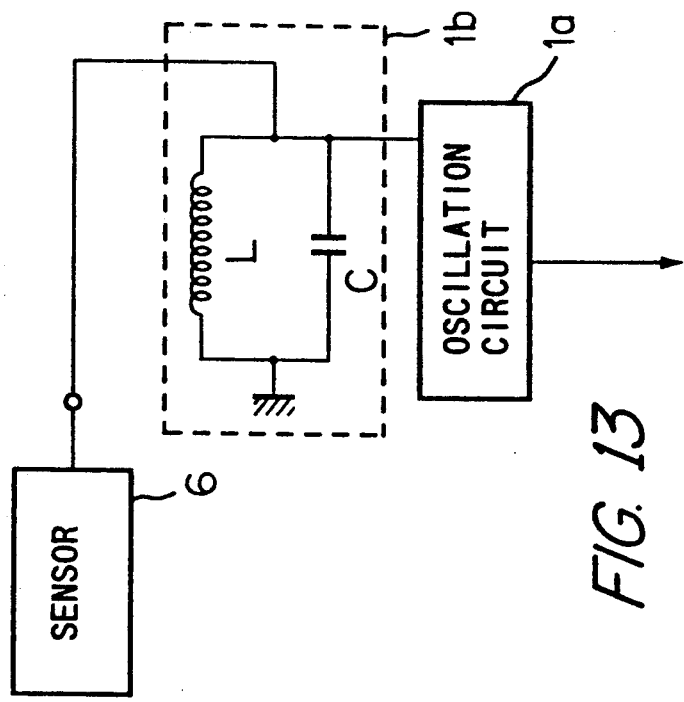
FIG. 13 is a block diagram of a high frequency oscillator in the prior art system of FIG. 12.
Figure 14:
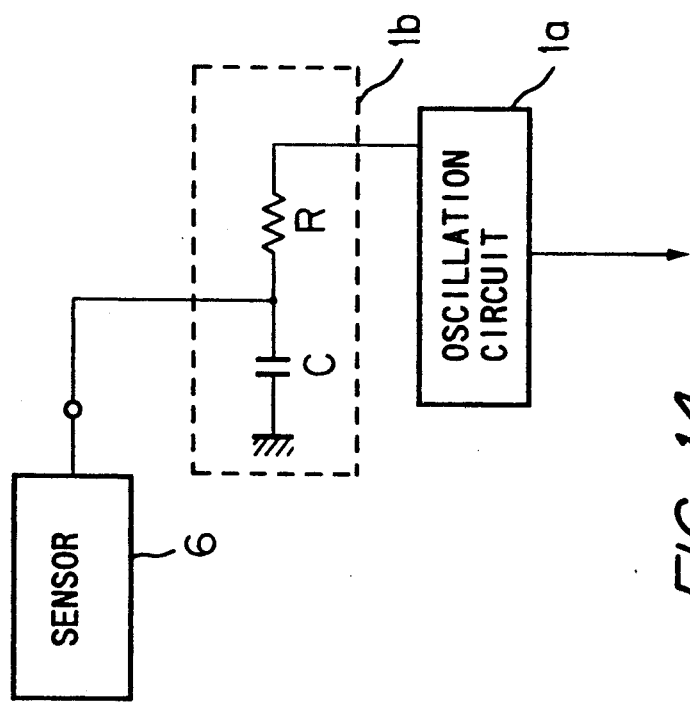
FIG. 14 is a block diagram of a low frequency oscillator in the prior art system of FIG. 12.

Contents of the operations given above will be explained with reference to FIG. 11. FIG. 11 is a diagram of assistance in explaining the principle to detect the variation in the stray capacitance in the sixth embodiment of the invention. Hence, the symbols in FIG. 11 are the same as those in FIG. 3. However, an arrow F indicates a direction in which the capture range Cr and the lock range Lr transit together on the basis of the transition of the output frequency ($f_2$) (freerunning frequency) of VCO 22b. A block surrounded by a dotted line G indicates a state of distribution of the frequencies when detecting the capacitance variation.

As depicted in FIG. 11, the capture range Cr and the lock range Lr exist on the basis of the freerunning frequency ($f_2$) of VCO 22b within the PLL circuit 22. If no capacitance variation is detected, setting is so effected that the intrinsic output frequency f of OSC 21 does not exist inwardly of the lock range Lr. Whereas if the capacitance variation is detected, the output frequency ($f_2$) (freerunning frequency) of VCO 22b and the intrinsic output frequency f of OSC 21 are initialized so that the output frequency f of OSC 21 enters the interior of the capture range Cr and is included therein. A state of being prepared with the detection of the variation in the electric capacitance or the like (stray capacitance, etc) is thereby provided. Then, the PLL circuit 22 is put into the non-locked state. In the detecting apparatus in this initial state, the PLL circuit 22 is in the non-locked state. Therefore, 1 (constant voltage) is outputted to the digital output signal $D_0$, while 0 (0 volt) is outputted to the analog output signal $A_0$.

Then, when the capacitance variation is detected, upon undergoing the influence thereof, as indicated by the arrow F, the freerunning frequency ($f_2$) itself of VCO 22b, the capture range Cr and the lock range Lr concomitant therewith transit together. The intrinsic output frequency f of OSC 21 enters the interior of the capture range Cr and is included therein, which has been varied as indicated by the dotted line G. Then, this PLL circuit is brought into the locked state, and the follow-up action after the intrinsic output frequency f of OSC 21 is started.

The various operations of the PLL circuit 22 under the locked condition are apparently much the same as those in the respective embodiments described so far. Namely in the interior of the PLL circuit 22, the output frequency ($f_2$) (freerunning frequency) itself of VCO 22b changes in accordance with the fluctuation signal of the stray capacitance that is obtained from the sensor 26. However, the phase comparator 22a makes a real-time comparison between a phase of the freerunning frequency after the transition and a phase of the intrinsic output frequency of OSC 21. The output voltage $v_1$ is thereby generated in the phase comparator 22a. This voltage $v_1$ is integrated in the loop filter 22c to generate the output voltage $v_2$ (control voltage of the freerunning frequency). The output frequency $f_2$ in a state where the freerunning frequency changes within the variable power range of VCO 22b is thereby modified in such a direction as to be equal to the previously fixed intrinsic output frequency f of OSC 21. The thus modified output frequency $f_2$ of VCO 22b becomes identical with the intrinsic output frequency f of OSC 21, and a phase difference comes to 90°. At this moment, a displacement quantity of the output frequency $f_2$ (the same as the output frequency f of OSC 21) of VCO 22b at that time with respect to the output frequency ($f_2$) (freerunning frequency) at the onset of detecting the capacitance appears to be the control voltage $v_2$ of the freerunning frequency. It is therefore possible to detect the variation in the stray capacitance.

A positive or negative voltage is linearly outputted outwards to the analog output signal $A_0$ of the analog output amplifier 23 for amplifying this freerunning frequency control voltage, corresponding to the fluctuation in the stray capacitance that is obtained from the sensor 26. Further, 0 (0 volt) is outputted to the digital output signal $D_0$ at that time because of the locked state.

As shown in the sixth embodiment, the detection accuracy can be more enhanced by using the method of fixing the output frequency f of OSC 21 than in the first through fifth embodiments discussed above. For example, if a crystal oscillator or the like is employed as a component, i.e., an oscillator of OSC 21, the accuracy of the output frequency f can be outstandingly improved. It is therefore feasible to detect the fluctuation signal of the electric capacitance (stray capacitance, etc) at a high accuracy in the locked state of the PLL circuit 22, the fluctuation signal being obtained from the sensor 26. Further, as stated in the first to fifth embodiments discussed above, the operation can be performed the same even in such a case as to keep the liquid level constant.

Note that in the first to fifth embodiments, the detecting apparatus is constructed by predetermining the respective characteristics of the loop filter 22c and VCO 22b in the initial state. According to the invention in the sixth embodiment, however, the freerunning frequency itself of VCO 22b transits on undergoing the influence of the capacitance variation. The characteristic possessed by the loop filter 22c and the oscillating characteristic possessed by VCO 22b remain invariable as in the initialized state. Adding to these points, setting is, it is required, effected so that the freerunning frequency itself of VCO 22b is transitable without spoiling the various operations of the PLL circuit 22 over the entire range of the capacitance variations (state variations) of the detected body. For instance, a value range of the freerunning frequency transitable with the detection of the capacitance variation is settled within a scope on the order of 10% of the value of the freerunning frequency in the initial state (before the transition). Further, the sixth embodiment has fully dealt with the case where the PLL circuit 22 changes from the non-locked state to the locked state, thereby detecting the state variation of the detected body. The sixth embodiment is, however, capable of corresponding to even a case where the detection is attempted by presetting the PLL circuit 22 in the locked state with respect to the intrinsic output frequency f of OSC 21 at the stage of initialization as in the precedent third embodiment. This is, as previously stated, based on the relative relation between the input frequency received by the PLL circuit 22 and the freerunning frequency of VCO 22b.

As discussed above, in the sixth embodiment, the sensor 26 for detecting the variation in the stray capacitance in contact or non-contact with the detected body is connected to VCO 22b including the time constant determining module of PLL circuit 22. Connected to this PLL circuit 22 is OSC 21 in which the fixed output frequency f is set, thus constructing the detecting apparatus. Then, the freerunning frequency ($f_2$) of the PLL circuit 22 and the width of the capture range Cr are respectively initialized so that the capture range Cr is capable of including (taking in) the output frequency f of OSC 21 when detecting the variation in the stray capacitance, the capture range being defined based on the initial freerunning frequency ($f_2$) of VCO 22b that is determined by the synthetic time constant obtained by adding up the variation value of the electric capacitance or the like (stray capacitance, etc) which is detected by the sensor 26 and the time constant preset by the time constant determining module of VCO 22b, or alternatively so that a release from the included output frequency f of OSC 21 is attainable. Detected thus is the variation in the control voltage of the freerunning frequency in the locked state of the PLL circuit 22, the variation being caused with the change in the electric capacitance or the like (stray capacitance, etc) that is detected by the sensor 26. The state variation of the detected body is then detected.

Note that the embodiment described above have dealt with the arrangement that the time constant determining module is constructed of CR (capacitor and resistor). The time constant is, however, determined also by LCR (L is a coil), and hence this module is not necessarily composed only of CR. Besides, in connection with the state variation of the detected body, not only the capacitance component but also the resistance component change equivalently. However, a large change in the frequency, in other words the detectable variation component is derived mainly from the change in the capacitance C. Therefore, the detection of the variation in the capacitance is more practical.

Furthermore, each of the embodiments discussed above is associated with the case of employing the PLL circuit 22 of such a type that the control voltage $v_2$ of the freerunning frequency disappears if the input frequency f entering the phase comparator 22a from outside is not included (in the non-locked state) in the capture range Cr or the lock range Lr of the PLL circuit 22 with respect to the control voltage $v_2$ of the freerunning frequency in the PLL circuit 22. There is, however, a PLL circuit of such a type as to continuously output a voltage having the minimum or maximum value (or reversal to this) in the variable range of the control voltage $v_2$ of the freerunning frequency which corresponds to the variable range of the output frequency $f_2$ irrespective of the PLL circuit 22 being in the non-locked state depending on whether the input frequency f exists in the higher portion or in the lower portion within the variable range of the output frequency $f_2$ possessed by the PLL circuit 22 even when the input frequency f is not included in the capture range Cr or the lock range Lr of the PLL circuit 22 according to a difference between the characteristic of the loop filter 22c and the oscillating characteristic of VCO 22b and differences both in type and in characteristic of the phase comparator 22a employed therein.

According to the present invention, if this type of PLL circuit is used, there may arise a case where the value of the detected result of the stray capacitance differs from the content explained in each of the precedent embodiments. Hence, for corresponding to this, when setting the initial state, the initial states of the above-mentioned phase comparator, the loop filter and VCO while considering a variety of characteristics thereof. Alternatively, the value of the detected result is modified (offset) and then read. Thus, it is possible to obtain the result equivalent to the content described in the respective embodiments discussed above. Namely, different types of multiple PLL circuits are usable for the method of detecting the variation in the stray capacitance by use of the PLL circuit according to the present invention.

The following excellent advantages are obtained in accordance with the present invention. Even when detecting an infinitesimal fluctuation in the stray capacitance, there is no obstacle in using the oscillator having a low frequency on the order of several kHz to several tens of KHz because of using the PLL circuit. The range in which the stray capacitance is detectable is sufficiently widened, and besides, the malfunction is remarkably small. Moreover, the detection of the change in the stray capacitance can be stably detected with an extremely minimized ambient influence by unnecessary electronic waves. Further, the detecting apparatus for practicing the method of this invention can be more miniaturized and easily constructed to have a stable performance owing to the present IC techniques. In addition, the versatility is high because of a wide detection range as well as being capable of replacement with a conventional apparatus. Consequently, the costs for installing the stray detecting means can be reduced down. Moreover, there is exhibited a secondary effect in the sensor used for the method of this invention, wherein the shape and form of the sensor unit do not become a subject of discussion on condition that the sensor is capable of capturing the variation in the stray capacitance and electrically transmitting it. Therefore, the present invention is extremely useful as a method of detecting the variation in the stray capacitance.

Although the illustrative embodiments of the present invention have been described in detail with reference to the accompanying drawings, it is to be understood that the present invention is not limited to those embodiments. Various changes or modifications may be effected by one skilled in the art without departing from the scope or spirit of the invention.

What is claimed is:

1. A method of detecting a variation in stray capacitance by use of a PLL circuit, comprising the steps of:
setting respectively a freerunning frequency and a capture range of a phase-locked loop circuit so that a range in which an output frequency of a pre-oscillator changes extends to an interior of said capture range of said phase-locked loop circuit, said output frequency being determined by a synthetic time constant obtained by adding up a variation value of an electric capacitance that is detected by a sensor and a reserve time constant preset in a time constant determining module when detecting the stray capacitance by employing said sensor for detecting the variation in the stray capacitance in contact or non-contact with a body to be detected and a capacitance detecting means including said pre-oscillator having said time constant determining module connected to said sensor and said phase-locked loop circuit connected to said pre-oscillator;

detecting a change in a freerunning frequency control voltage in a locked state of said phase-locked loop circuit, the change being caused with the variation in the electric capacitance that is detected by said sensor; and detecting a state variation of said detected body.

2. The method of detecting the variation in the stray capacitance by use of the PLL circuit as set forth in claim 1, further comprising the steps of: detecting the fact that the variation in the electric capacitance that is detected by said sensor is caused in a specific area in the whole range of the variation by arbitrarily adjusting a width of the capture range of said phase-locked loop circuit; and detecting a state of the variation produced in said detected body.

3. The method of detecting the variation in the stray capacitance by use of the PLL circuit as set forth in claim 1, further comprising the steps of: previously setting said phase-locked loop circuit into the locked state by adjusting its freerunning frequency to an output frequency of said pre-oscillator; detecting a change in the output frequency of said pre-oscillator, the change being produced with the variation in the electric capacitance that is detected by said sensor, in the variation directed to an exterior of the lock range of said phase-locked loop circuit; and detecting the state variation of said detected body.

4. The method of detecting the variation in the stray capacitance by use of the PLL circuit as set forth in claim 1, further comprising the steps of: detecting a deviation quantity between a value of the freerunning control voltage of said phase-locked loop circuit when detecting no variation in the electric capacitance and a value thereof when the variation in the electric capacitance is caused; and finding out increase/decrease directions of the variation in the electric capacitance that is detected by said sensor and also magnitudes of the increase and the decrease.

5. The method of detecting the variation in the stray capacitance by use of the PLL circuit as set forth in claim 1, further comprising the steps of: making a difference—the difference between a value of the freerunning frequency control voltage of said phase-locked loop circuit at a critical point where the variation in the electric capacitance is detectable and a value at a limit point where the detection in the electric capacitance is undetectable, the difference being induced by a hysteresis existing between the capture range and the lock range of said phase-locked loop circuit—corresponding to a detection level difference during the increase and decrease of the electric capacitance that is detected by said sensor; and detecting two states of said detected body.

6. A method of detecting a variation in stray capacitance by use of a PLL circuit, comprising the steps of:

providing a sensor for detecting a variation in the stray capacitance in contact or non-contact with a body to be detected, a phase-locked loop circuit including a time constant determining module connected to said sensor and a pre-oscillator connected to said phase-locked loop circuit and having an intrinsic output frequency;

setting respectively a freerunning frequency and a capture range of said phase-locked loop circuit so that the capture range is brought into a first state to include the intrinsic output frequency of said pre-oscillator with a variation in electric capacitance that is detected by said sensor or into a second state to release from the included intrinsic output frequency of said pre-oscillator, the capture range being defined based on a freerunning frequency of a voltage control oscillator that is determined by a synthetic time constant obtained by adding up a variation value of the electric capacitance which is detected by said sensor and a reserve time constant preset in said time constant determining module;

detecting the variation in the freerunning control voltage in the locked state of said phase-locked loop circuit, the variation being caused with the change in the electric capacitance that is detected by said sensor; and detecting a state variation of said detected body.

* * * * *